US008599598B1

(12) United States Patent
Patel et al.

(10) Patent No.: US 8,599,598 B1
(45) Date of Patent: Dec. 3, 2013

(54) 3T DEVICE BASED MEMORY CIRCUITS AND ARRAYS

(75) Inventors: Rakesh H. Patel, Cupertino, CA (US); Shankar Prasad Sinha, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 107 days.

(21) Appl. No.: 13/287,957

(22) Filed: Nov. 2, 2011

Related U.S. Application Data

(63) Continuation of application No. 12/535,395, filed on Aug. 4, 2009, now Pat. No. 8,130,559.

(60) Provisional application No. 61/188,081, filed on Aug. 6, 2008.

(51) Int. Cl.
*G11C 11/00* (2006.01)
(52) U.S. Cl.
USPC .......................................... 365/131; 365/190
(58) Field of Classification Search
USPC .......................... 365/131, 190, 148, 157, 163
See application file for complete search history.

(56) References Cited

U.S. PATENT DOCUMENTS

| 7,145,810 | B1 | 12/2006 | De Lange | |
|---|---|---|---|---|
| 7,494,849 | B2 | 2/2009 | Oliva et al. | |
| 7,511,532 | B2 | 3/2009 | Derharcobian et al. | |
| 7,646,642 | B2 * | 1/2010 | Fujito et al. | 365/185.18 |
| 2001/0038109 | A1 * | 11/2001 | Kowarik et al. | 257/295 |
| 2002/0018356 | A1 * | 2/2002 | Hoffmann et al. | 365/145 |
| 2004/0047197 | A1 * | 3/2004 | Jeon et al. | 365/200 |
| 2004/0105296 | A1 * | 6/2004 | Ho | 365/145 |
| 2007/0297252 | A1 | 12/2007 | Singh | |
| 2010/0039852 | A1 | 2/2010 | Luk et al. | |

FOREIGN PATENT DOCUMENTS

WO   WO-2008/032069 A1   3/2008

* cited by examiner

*Primary Examiner* — Vu Le
(74) *Attorney, Agent, or Firm* — Mauriel Kapouytian Woods LLP; Ararat Kapouytian

(57) ABSTRACT

In one aspect, a memory circuit is provided. The memory circuit includes a first three-terminal (3T) resistive memory device and a second 3T resistive memory device coupled to the first 3T resistive memory device. In another aspect a memory array with memory circuits having 3T devices is provided. In yet another aspect, a method of programming a memory array is provided.

40 Claims, 13 Drawing Sheets

3T DEVICE BASED MEMORY CIRCUITS AND ARRAYS

CROSS-REFERENCE TO RELATED APPLICATIONS

This application is a continuation application of U.S. application Ser. No. 12/535,395 of Rakesh H. Patel et al., filed on Aug. 4, 2009 and entitled "MEMS Switching Device and Conductive Bridge Device Based Circuits" and claims the benefit thereof. This application, through U.S. application Ser. No. 12/535,395, also claims the benefit of U.S. Provisional Application No. 61/188,081 of Rakesh H. Patel et al., filed on Aug. 6, 2008 and entitled "Cantilever Device and 3T Device Based Memory Circuits and Multiplexers".

BACKGROUND

The present invention relates to circuits.

Programmable logic devices (PLDs) (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names), are well-known integrated circuits (ICs) that provide the advantages of fixed ICs with the flexibility of custom ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Placing new data into the configuration elements programs or reprograms the PLD's logic functions and associated routing pathways. Configuration elements that are field programmable are often implemented as random access memory (RAM) cells, which in PLDs are sometimes referred to a "configuration RAM" (CRAM)). CRAMs are generally implemented as static RAM (SRAM). Thus, CRAMs generally refer to SRAM. As such, the term CRAM is herein used to refer to configuration memory implemented as SRAM. The CRAM is typically arranged in an array of columns and rows of memory cells. Each cell of a CRAM is typically connected to the gate terminal of a corresponding pass gate, which normally acts as a switch connecting a data input terminal to a data output terminal.

CRAMs suffer from a number of disadvantages. First, they are susceptible to soft error upsets (SEUs), which are sometimes referred to as "one-off errors". The soft error rate (SER) increases as component device sizes are reduced or as voltages applied to the component devices (e.g., $V_{CC}$) are reduced. As a result, soft errors limit lowering the size of the component devices used in the CRAM or the voltages applied to its component devices. Consequently, larger component devices and higher applied voltages are used. Moreover, at times, layouts that add more capacitance to devices are used, which makes the CRAM less susceptible to soft errors. This complicates the layout process. Second, as CRAMs are volatile memories, each time a PLD is powered on, configuration data must be loaded and stored in the CRAM. This causes undesirable delays in readying the PLD.

One way to correct soft errors in CRAM is to reload the configuration data. This, however, requires interrupting the operation of the PLD. Another technique to correct soft errors is to use multiple redundancy (e.g., triple redundancy). This, in turn, requires using a larger CRAM block. Additionally, both of these methods require use of error detection methods.

Similarly, a multiplexer that uses a CRAM-based look-up-table (LUT) for decoding (e.g., select signals of the multiplexer) also suffers from soft errors and volatility issues discussed above. Also, the performance of the switches in the multiplexer and thus of the multiplexer itself degrades with smaller process nodes used for fabricating devices making up the multiplexer. This is because the supply voltage for smaller process nodes is smaller and because there is a lower limit on reducing the threshold voltage for transistors used as switches in the multiplexer. As a result, scaling down of the process nodes reduces the current through the switches.

Embodiments of the present invention arise in this context.

SUMMARY

In one aspect, an embodiment of the present invention provides a memory circuit. In one embodiment, the memory circuit includes a first three-terminal (3T) resistive memory device and a second 3T resistive memory device coupled to the first 3T resistive memory device.

In another aspect, an embodiment of the present invention provides a memory array. In one embodiment, the memory array includes: (1) M times N memory circuits including M rows of memory circuits coupled to M pairs of bitlines and N address lines, where M is an integer greater than 1, N is an integer greater than 1, each row of memory circuits of the M rows of memory circuits includes N memory circuits, each row of memory circuits is coupled to a respective pair of bitlines of the M pairs of bitlines, and each row of memory circuits is coupled to the N address lines, where, for each row of memory circuits, each memory circuit is coupled to a respective address line of the N address lines; (2) M times N test switches coupled to the M times N memory circuits, where each test switch of the M times N test switches is coupled to an output terminal of a respective memory circuit of the M times N memory circuits; and (3) M times N freeze circuits coupled to the M times N memory circuits, wherein each freeze circuit of the M times N freeze circuits is coupled to an output terminal of a respective memory circuit of the M times N memory circuits; where each memory circuit of the M times N memory circuits includes a first 3T conductive bridge device and a second 3T conductive bridge device coupled to the first 3T conductive bridge device, where an input terminal of the first 3T conductive bridge device and an input terminal of the second 3T conductive bridge device are respectively coupled to a first bitline and a second bitline of a respective pair of bitlines of the M pairs of bitlines, further where an address terminal of the first 3T conductive bridge device and an address terminal of the second 3T conductive bridge device are coupled to a respective address line of the N address lines, and further where an output terminal of the first 3T conductive bridge device and an output terminal of the second 3T conductive bridge device are coupled to a respective test switch of the M times N test switches and a respective freeze circuit of the M times N freeze circuits.

In another aspect, an embodiment of the present invention provides a method of programming a memory array.

BRIEF DESCRIPTION OF THE DRAWINGS

For purpose of explanation, several aspects of a particular embodiment of the invention are described by reference to the following figures.

DETAILED DESCRIPTION

The following description is presented to enable any person skilled in the art to make and use embodiments of the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
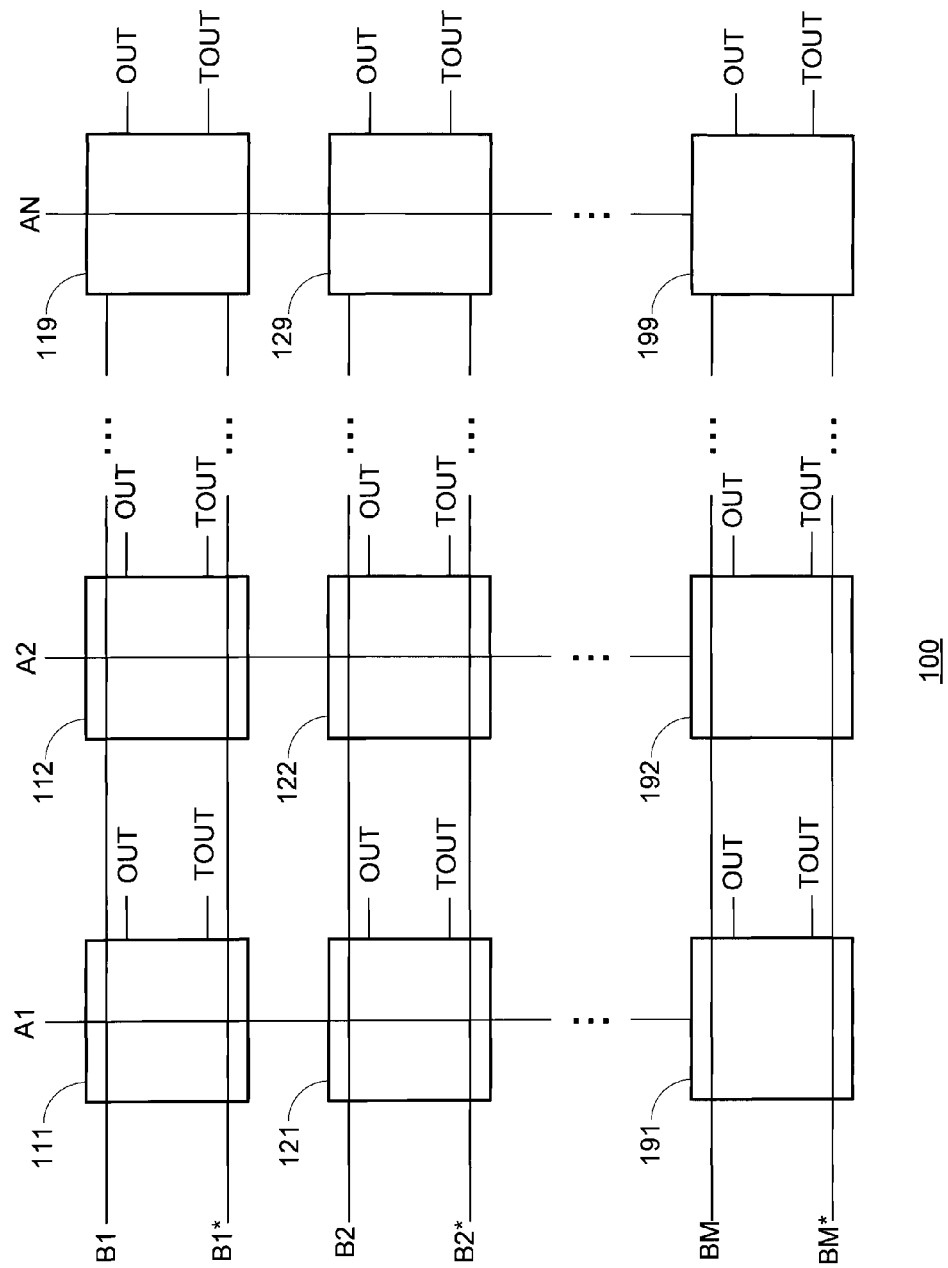
FIG. 1 is a block diagram of one embodiment of a memory array of the present invention.

FIG. 1 is a block diagram of one embodiment of a memory array of the present invention. Memory array 100, which may also herein be referred to as memory circuit array 100, includes M rows of memory circuits and N columns of memory circuits, where M and N are integers representing the number of rows and columns, respectively, in memory circuit array 100. A memory circuit may also herein be referred to as a memory cell. In memory array 100, M and N are each greater than 2, but more generally M and N are each greater than 1. Memory array 100 includes memory circuits 111, 112, and 119 coupled to bitlines B1 and B1*, memory circuits 121, 122, and 129 coupled to bitlines B2 and B2*, and memory circuits 191, 192, and 199 coupled to bitlines BM and BM*. In other words, a pair of bitlines is coupled to all the memory circuits on the same row of memory array 100. As shown in FIG. 1, memory circuits 111, 121, and 191 are coupled to address line A1, memory circuits 112, 122, and 192 are coupled to address line A2, and memory circuits 119, 129, and 199 are coupled to address line AN. In other words, each address line is coupled to all the memory circuits in a column of memory array 100. A memory circuit coupled to an address line may also herein be referred to as a memory circuit on an address line. As also shown in FIG. 1, each memory circuit in memory array 100 has an output terminal OUT and a test output terminal TOUT. It is to be noted that ellipses in FIG. 1 represent one or more memory circuits in memory array 100 that are not shown.

As illustrated in FIG. 1, memory array 100 has M rows of memory circuits, where each row includes N memory circuits. It is to be noted that, in another embodiment, each row need not include N memory circuits. In other words, some rows may include more or less than N memory circuits. Similarly, as illustrated in FIG. 1, memory array 100 has N columns of memory circuits, where each column includes M memory circuits. It is to be noted that, in another embodiment, each column need not include M memory circuits. In other words, some columns may include more or less than M memory circuits.

Figure 2:
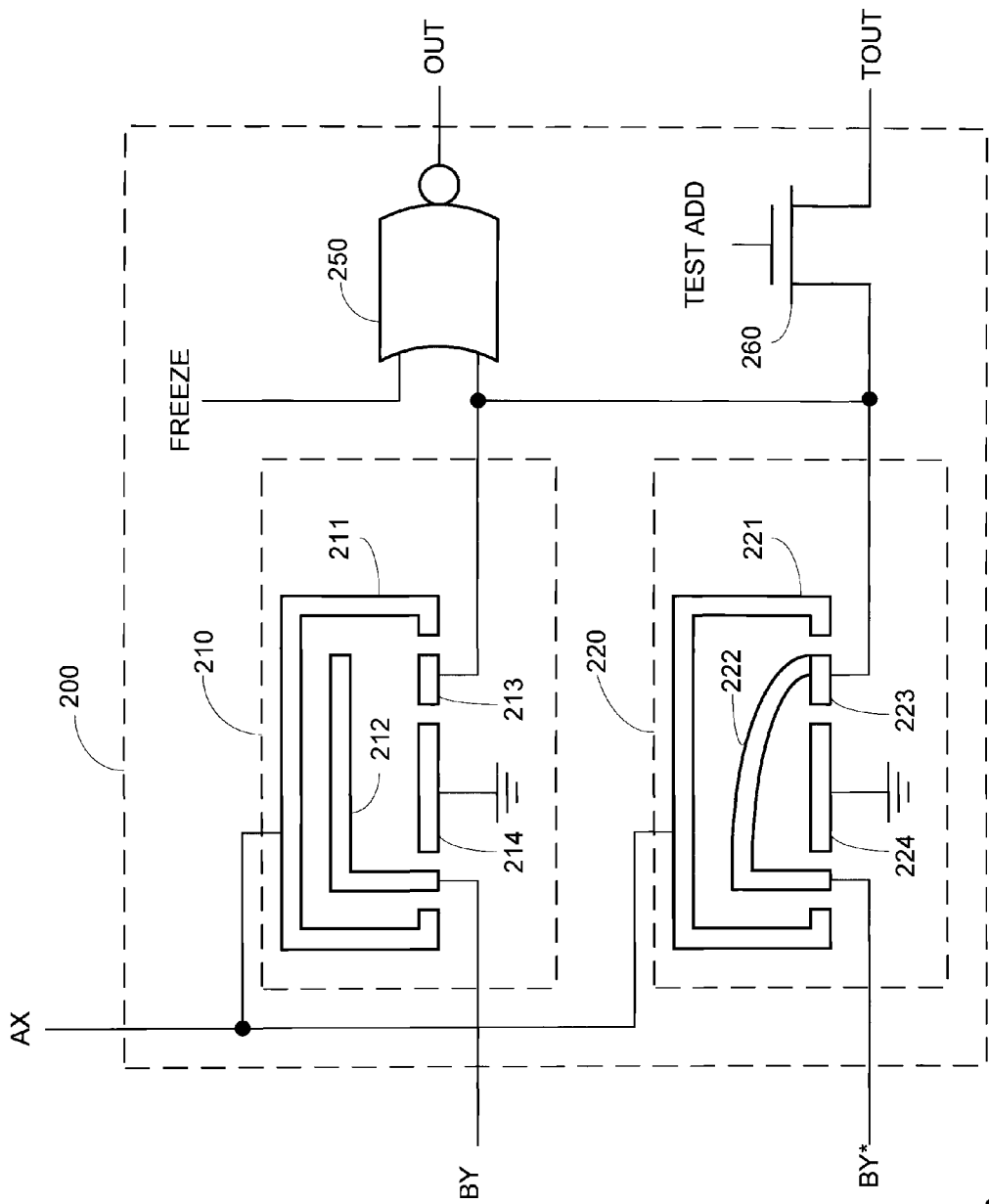
FIG. 2 is a detailed diagram of one embodiment of a memory circuit in the memory array of FIG. 1.

FIG. 2 is a detailed diagram of one embodiment of a memory circuit in the memory array of FIG. 1. In FIG. 2, memory circuit 200 includes first microelectromechanical system (MEMS) switching device 210, second MEMS switching device 220, freeze NOR gate 250, and test switch 260. First MEMS switching device 210 and second MEMS switching device 220 may also herein be referred to as first MEMS cantilever device 210 and second MEMS cantilever device 220 or first cantilever device 210 and second cantilever device 220. In one embodiment, first cantilever device 210 and second cantilever device 220 may be such as those provided by Cavendish Kinetics of San Jose, Calif.

First cantilever device 210 includes address terminal 211 connected to address line AX (where X is an integer greater than or equal to 1 and less than or equal to N and represents the number of the address line), lever 212 (which may also herein be referred to as input terminal 212) connected to bitline BY (where Y is an integer greater than or equal to 1 and less than or equal to M and represents the number of the bitline), output terminal 213, and reference voltage terminal 214. In one embodiment, the voltage of address terminal 211, lever 212, and output terminal 213 is referred to in reference to the voltage of reference voltage terminal 214. In one embodiment, reference voltage terminal 214 is connected to ground (i.e., 0 volts). In another embodiment, reference voltage terminal 214 may be connected to some other reference voltage.

Similarly, second cantilever device 220 includes address terminal 221 connected to address line AX, lever 222 (which may also herein be referred to as input terminal 222) connected to bitline BY*, output terminal 223, and reference voltage terminal 224. In one embodiment, the voltage of address terminal 221, lever 222, and output terminal 223 is referred to in reference to the voltage of reference voltage terminal 224. In one embodiment, reference voltage terminal 224 is connected to ground. In another embodiment, reference voltage terminal 224 may be connected to some other reference voltage.

As can be noted from the above and FIG. 2, each of cantilever devices 210 and 220 includes four terminals. As such, cantilever devices 210 and 220 may herein be more generally referred to as four-terminal (4T) devices. They may also herein be referred to as 4T switches, 4T memory devices, or 4T cantilever devices.

In one embodiment, first cantilever device 210 has two states, an erase state and a program state. In an erase state, which may also herein be referred to as an open switch state, lever 212 is not mechanically connected to output terminal 213. As a result, in the erase state, output terminal 213 is electrically isolated from lever 212 and bitline BY which is coupled to lever 212. Cantilever device 210 shown in FIG. 2 is in an erase state. Similarly, the position of lever 212, in FIG. 2, is an erase position. In the erase state, there is no leakage current in the cantilever devices (i.e., the cantilever devices have a leakage current of zero) since the levers are electrically isolated from the output terminals.

In a program state, which may also herein be referred to as a closed switch state, the lever of the cantilever device is mechanically connected to the output terminal of the cantilever device. Cantilever device 220 shown in FIG. 2 is in a program state. Similarly, position of lever 222, in FIG. 2, is a program position. As shown in FIG. 2, lever 222 is mechanically connected to output terminal 223. In FIG. 2, lever 222 is electrically connected to bitline BY*. As a result, output terminal 223 is electrically connected to bitline BY*.

In a cantilever device, such as cantilever device 210 or 220, when there is a voltage difference between the lever and the reference voltage terminal, then there is an electrostatic force on both. As the reference voltage terminal is fixed, it will not move. On the hand, the lever is not fixed and is subject to move due to this force. When the voltage difference is sufficiently large, it causes the lever to move towards the reference voltage terminal and make contact (both mechanical and electrical) with the output terminal. When the electrostatic force on the lever is removed, stiction keeps the lever connected to the output terminal. Similarly, when there is a voltage difference between the lever and the address terminal, then there is an electrostatic force on both. As the address terminal is fixed, it will not move. On the other hand, the lever is not fixed and is subject to move due to this force. When the voltage difference is sufficiently large, it causes the lever to move towards the address terminal and make mechanical contact with the address terminal. This mechanical contact does not result in conducting contact (or electrical contact) between the lever and the address terminal since the address terminal has an insulating layer where the lever makes mechanical contact with the address terminal. When there are electrostatics forces on the lever due to voltage differences between the lever and the reference voltage terminal and between the lever and the address terminal, assuming the voltage differences are the same, then the electrostatic force on the lever due to the more proximate of the two terminals will be stronger. As will be appreciated by those skilled in the art, the relative size of the two voltage differences is also a factor in the strength and direction of the overall electrostatic force on the lever.

A voltage difference (between the lever and the input terminal or the lever and the reference voltage terminal) sufficient to cause the lever to move from a program state to an erase state or vice versa is a voltage at or above the threshold voltage for the 4T device for causing such a state change. In one embodiment, a power supply voltage (Vcc) of 1.1 volts is such a sufficient voltage. In the context of a 4T device, such a voltage difference is herein referred to as a threshold voltage difference. A voltage difference below the threshold voltage for switching the state of the device may herein be referred to as a non-threshold voltage difference. Similarly, Vcc may herein be referred to as high binary voltage or high voltage. Similarly, ground potential may herein be referred to as a low binary voltage or low voltage.

When associated with an address terminal, a bitline terminal, a reference terminal, and an output terminal, a high binary voltage may herein be respectively referred to as a high address terminal voltage, a high bitline terminal voltage, a high reference terminal voltage, and a high output terminal voltage. A high address terminal voltage, a high bitline terminal voltage, a high reference terminal voltage, and a high output terminal voltage may also herein be respectively referred to as a high binary value address voltage, a high binary value bitline voltage, a high binary value reference voltage, and a high binary value output voltage. Similarly, when associated with an address terminal, a bitline terminal, a reference terminal, and an output terminal, a low binary voltage may be respectively referred to as a low address terminal voltage, a low bitline terminal voltage, a low reference terminal voltage, and a low output terminal voltage. A low address terminal voltage, a low bitline terminal voltage, a low reference terminal voltage, and a low output terminal voltage may also herein be respectively referred to as a low binary value address voltage, a low binary value bitline voltage, a low binary value reference voltage, and a low binary value output voltage.

Table 1 below is a truth table for a 4T device, such as cantilever device 210 or 220. More specifically, Table 1 shows the relationship between (1) the voltages at address, reference voltage, and input terminals of a cantilever device and the previous state of the cantilever device and (2) the new state of the cantilever device. In Table 1, 0 and 1 refer to a low binary value and a high binary value, respectively. In one embodiment, the low binary value is ground potential, whereas the high binary value is Vcc, which in one embodiment is 1.1 volts.

TABLE 1

| Reference terminal voltage | Address terminal voltage | Input terminal voltage | Previous state of cantilever device | New state of cantilever device |
| --- | --- | --- | --- | --- |
| 0 | 0 | 0 | PROGRAM | PROGRAM |
| 0 | 0 | 0 | ERASE | ERASE |
| 0 | 0 | 1 | PROGRAM | PROGRAM |
| 0 | 0 | 1 | ERASE | ERASE |
| 0 | 1 | 0 | PROGRAM | ERASE |
| 0 | 1 | 0 | ERASE | ERASE |
| 0 | 1 | 1 | PROGRAM | PROGRAM |
| 0 | 1 | 1 | ERASE | PROGRAM |
| 1 | 0 | 0 | PROGRAM | PROGRAM |
| 1 | 0 | 0 | ERASE | PROGRAM |
| 1 | 0 | 1 | PROGRAM | ERASE |
| 1 | 0 | 1 | ERASE | ERASE |
| 1 | 1 | 0 | PROGRAM | PROGRAM |
| 1 | 1 | 0 | ERASE | ERASE |
| 1 | 1 | 1 | PROGRAM | PROGRAM |
| 1 | 1 | 1 | ERASE | ERASE |

As can be seen in Table 1, when the address and reference voltage terminals of a cantilever device are at the same voltage level, then the cantilever device remains in its previous state (i.e., program or erase) regardless of the voltage at the input terminal. When the reference terminal voltage is 0 and the address terminal voltage is 1, if the input terminal voltage is 0, then the cantilever device is placed in an erase state regardless of its previous state. Similarly, when the reference terminal voltage is 0 and the address terminal voltage is 1, if the input terminal voltage is 1, then the cantilever device is placed in a program state regardless of its previous state.

When the reference terminal voltage is 1 and the address terminal voltage is 0, if the input terminal voltage is 0, then the cantilever device is placed in a program state regardless of its previous state. Similarly, when the reference terminal voltage is 1 and the address terminal voltage is 0, if the input terminal voltage is 1, then the cantilever device is placed in an erase state regardless of its previous state.

Below is a description of the operation of cantilever device 210 and 220 where the reference voltage terminal is grounded as depicted in FIG. 2. Cantilever devices 210 and 220 may also operate with the reference voltage terminal coupled to Vcc or some other appropriate voltage. In case the reference voltage terminal is coupled to some voltage potential other than ground, voltages at the other terminals of the cantilever device would be adjusted from that of the below description to provide the desired result.

In first cantilever device 210, with reference voltage terminal 214 coupled to ground, when address terminal 211 is at a low address voltage, the lever 215 remains at its previous position regardless of the voltage of bitline BY. On the other hand, when the address terminal 211 is at a high address voltage, (1) regardless of its previous position, first cantilever device 210 will be in the erase position when the voltage of bitline BY is at a low bitline voltage and (2) regardless of its previous position, first cantilever device 210 will be in the program position when the voltage of bitline BY is at a high bitline voltage.

As noted above, memory circuit 200 also includes freeze NOR gate 250 and test switch 260. One input terminal of freeze NOR gate 250 is coupled to a FREEZE signal and the other input terminal of freeze NOR gate 250 is coupled to output terminal 213 of first cantilever device 210 and output terminal 223 of second cantilever device 220. The output terminal of freeze NOR gate 250 represents the output terminal of memory circuit 200. Similarly, test switch 260 is coupled to output terminals 213 and 223. The gate of test switch 260 is coupled to a test address signal TEST ADD. Finally, a third terminal of test switch 260 provides a test output signal TOUT. In one embodiment, test switch 260 is an N-channel metal oxide semiconductor (NMOS) device.

When FREEZE signal has a high binary value, the output of freeze NOR gate 250 has a low binary value regardless of the value of the input signal that freeze NOR gate 250 receives on its input terminal coupled to output terminals 213 and 214. As explained in greater detail below, in such a case, the output signal of memory circuit 200 is frozen. As also explained in greater detail below, this prevents toggling of the output signal of memory circuit 200 as the bitline voltages of the bitline pair (BY and BY*) coupled to memory circuit 200 and other memory circuits are varied during programming of the memory array.

When test address signal TEST ADD has a high binary value, test switch 260 is on and provides a test output signal TOUT that can be used to determine whether first cantilever device 210 or second cantilever device 220 is in the desired state.

In one embodiment, a Vcc of approximately 1.1 volts and ground potential are respectively a binary high value and a binary low value for devices in the freeze circuits and test switches.

In memory circuit 200, freeze NOR gate 250 and test switch 260 are shown as being included in memory circuit 200. In another embodiment, memory circuit 200 may be defined not to include freeze NOR gate 250 and test switch 260. In such a case, memory circuit 200 would have one output terminal and freeze NOR gate 250 and test switch 260 would be coupled to that output terminal as they are coupled to output terminals 213 and 223 in FIG. 2. Also, although, in memory circuit 200, a freeze NOR gate 250 is used for a freeze circuit, in another embodiment, another logic device or combination of logic devices may be used to represent the freeze circuit. For example, in another embodiment, a NAND gate may be used to represent the freeze circuit.

Figure 3A:
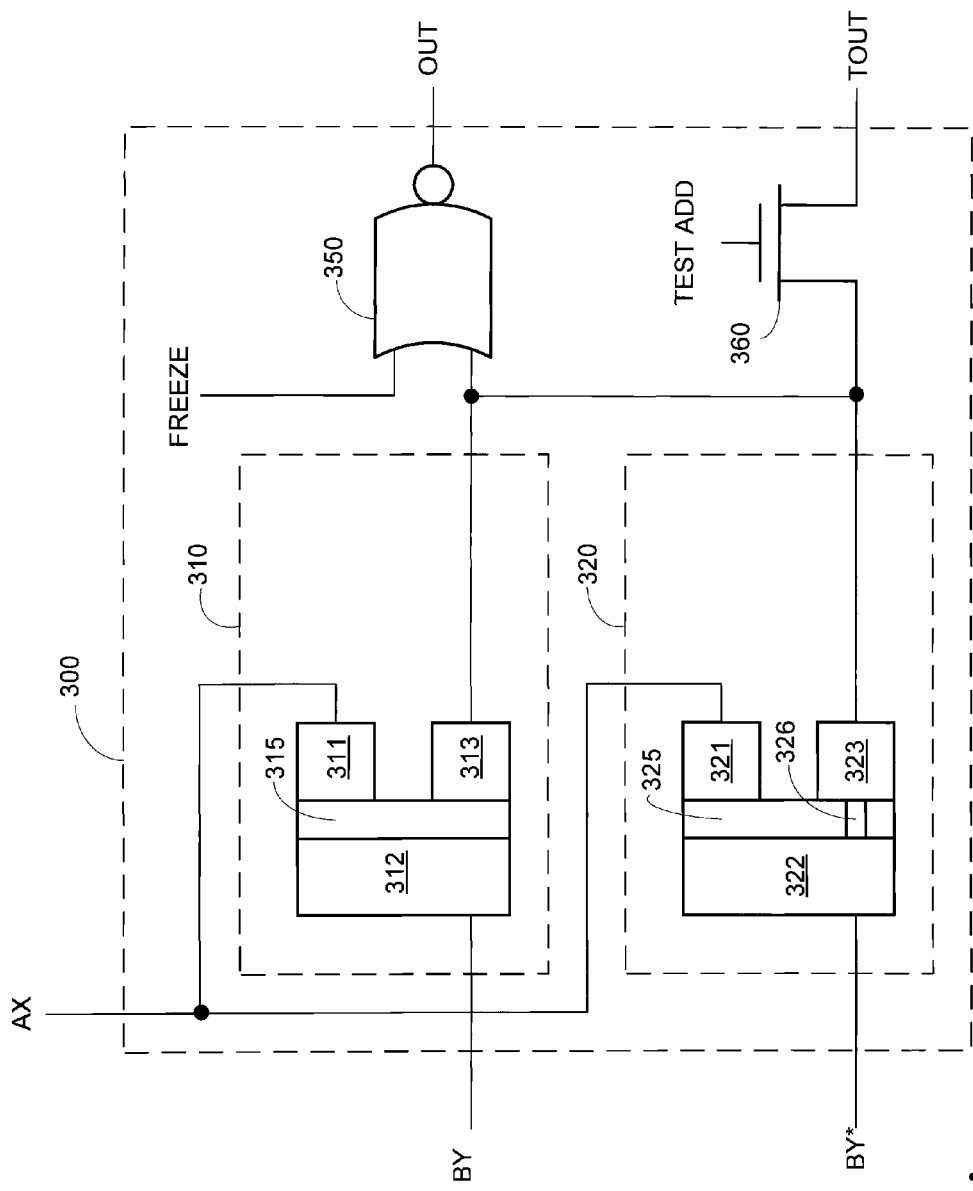
FIG. 3A is a detailed diagram of another embodiment of a memory circuit in the memory array of FIG. 1.

FIG. 3A is a detailed diagram of another embodiment of a memory circuit in the memory array of FIG. 1. In FIG. 3A, memory circuit 300 includes first three-terminal (3T) device 310, second 3T device 320, freeze NOR gate 350, and test switch 360. It is to be noted that 3T devices may herein be referred to as a 3T switches or 3T memory devices. In one embodiment, first 3T device 310 and second 3T device 320 are each a 3T resistive memory device. More specifically, in one embodiment, they are each a 3T conductive bridge device. In one embodiment, first 3T device 310 and second 3T device 320 may be 3T conductive bridge devices provided by NEC Corporation of Tokyo, Japan.

Figure 4:
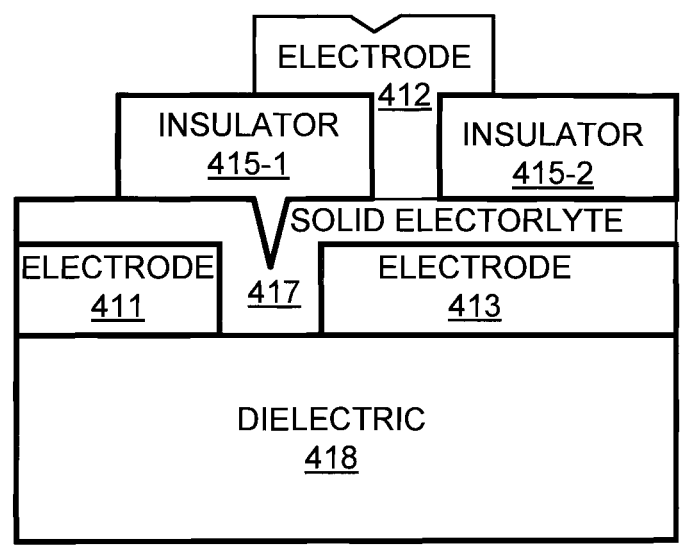
FIG. 4 illustrates a cross sectional view of one embodiment of a 3T device in the memory circuit of FIG. 3A.

FIG. 4 illustrates a cross sectional view of one embodiment of a 3T device in the memory circuit of FIG. 3A. In FIG. 4, 3T device 400 includes electrode layers 411, 412, and 413, insulators layers 415-1 and 415-2, solid electrolyte layer 417, and dielectric layer 418. In one embodiment, electrode layer 411 is a copper (Cu) gate layer and is coupled to the address line, electrode layer 412 is a platinum (Pt) drain layer and is coupled to a bitline, i.e., an input terminal, and electrode layer 413 is a Cu source layer and is coupled to the output terminal. In one embodiment, insulator layers 415-1 and 415-2 are composed of chloromethylated calixarene (which is an electron beam negative resist material). In another embodiment, insulator layers 415-1 and 415-2 may be composed of silicon nitride ($Si_3N_4$). In one embodiment, each of insulator layers 415-1 and 415-2 are approximately 100 to 200 nanometers (nm) thick. In one embodiment, solid electrolyte layer 417 is composed of copper sulfide ($Cu_2S$), silver sulfide ($Ag_2S$), and tantalum oxide ($Ta_2O_5$). Also, in one embodiment, solid electrolyte layer 417 is approximately 20 to 100 nm thick. In one embodiment, dielectric layer 418 is composed of silicon oxide ($SiO_2$). It is to be noted that 3T device 400 is not limited to the materials and layer thickness examples provided above. It is also to be noted that FIG. 4 is not drawn to scale and is intended to be illustrative of the general structure of an embodiment of the 3T device used in the present invention.

In one embodiment, 3T device 400 may be in an erase state or a program state. In erase state, electrode layer 413 is electrically isolated from electrode layer 412. In other words, the output terminal of 3T device 400 is electrically isolated from its input terminal. In program state, electrode layer 413 is not electrically isolated from electrode layer 412 because a conductive bridge couples the two layers. In other words, the output terminal of 3T device 400 is electrically coupled to its input terminal.

Table 2 below is a truth table for a 3T conductive bridge device. More specifically, Table 2 shows the relationship between (1) the voltages at address and input terminals of a 3T conductive bridge device and the previous state of the 3T conductive bridge device and (2) the new state of the 3T conductive bridge device. In one embodiment, Vcc is 1.1 volts.

TABLE 2

| Input Terminal Voltage | Address Terminal Voltage | Previous State of 3T Device | Next State of 3T Device |
| --- | --- | --- | --- |
| 0 | 0 | ERASE | ERASE |
| 0 | 2.5 volts | ERASE | PROGRAM |
| Vcc | 0 | ERASE | ERASE |

TABLE 2-continued

| Input Terminal Voltage | Address Terminal Voltage | Previous State of 3T Device | Next State of 3T Device |
|---|---|---|---|
| Vcc | Vcc | ERASE | ERASE |
| 0 | 0 | PROGRAM | PROGRAM |
| 0 | Vcc | PROGRAM | PROGRAM |
| 0 | −2.5 volts | PROGRAM | ERASE |
| Vcc | Vcc | PROGRAM | PROGRAM |

As can be seen from Table 2 above, when the address terminal voltage is 2.5 volts higher than the input terminal voltage, then the 3T conductive bridge device is placed in the program state from the erase state. On the other hand, when the address terminal voltage is 2.5 volts lower than the input terminal voltage, then the 3T conductive bridge device is placed in the erase state from the program state. In Table 2, the address terminal voltage is 2.5 volts lower than the input terminal voltage because the address terminal voltage is at −2.5 volts whereas the input terminal voltage is at ground. Those skilled in the art would recognize that the address terminal voltage may be 2.5 volts lower than the input terminal voltage using different voltages at the two terminals. For example, if the address terminal voltage is at ground potential and the input terminal voltage is at 2.5 volts, then the address terminal voltage would be 2.5 volts lower than the input terminal voltage. As can also be seen from Table 2, when the address and voltage terminal voltages are the same, then the 3T conductive bridge device remains in its previous state. Finally, when the address terminal voltage is Vcc volts above or below the input voltage terminal, the 3T conductive bridge device remains in its previous state. More generally, when the voltage difference between the address terminal voltage and the input terminal voltage is less than 2.5 volts, then the 3T conductive bridge device remains in its previous state. It is to be noted that, in one embodiment, when the 3T conductive bridge device is in an erase state, the output terminal voltage is floating. On the other hand, when the 3T conductive bridge device is in a program state, then the output terminal voltage is equal to the input terminal voltage.

A voltage difference between the input terminal voltage and the address terminal voltage sufficient to cause the 3T conductive bridge device to transition from an erase state to a program state or vice versa is a voltage at or above the threshold voltage for the 3T conductive bridge device for causing such a transition. In the context of a 3T conductive bridge device, such a voltage difference is herein referred to as a threshold voltage difference. In one embodiment, a voltage difference of 2.5 volts is such a sufficient voltage difference. A voltage difference whose magnitude is smaller than the magnitude of the threshold voltage difference for switching the state of the device may herein be referred to as a non-threshold voltage difference. A terminal whose voltage is equal to the threshold voltage relative to ground potential may be referred to as a terminal whose voltage is at the threshold voltage. Similarly, a ground potential may herein be referred to as a low binary voltage. Also, in the context of a 3T conductive bridge device, as in the context of a cantilever device, a Vcc voltage may herein be referred to as a high binary voltage.

Referring back to FIG. 3A, first 3T device 310 includes address terminal 311 connected to address line AX, input terminal 312 connected to bitline BY, output terminal 313 providing an output of first 3T device 310, and insulator 315 electrically isolating address terminal 311, input terminal 312, and output terminal 313 from one another.

Similarly, second 3T device 320 includes address terminal 321 connected to address line AX, input terminal 322 connected to bitline BY*, output terminal 323 providing an output of second 3T device 320, insulator 325 electrically isolating address terminal 321 from input terminal 322, and bridge 326 coupling input terminal 322 to output terminal 323.

As noted above, in an erase state, the input terminal is electrically isolated from the output terminal of the 3T device. First 3T device 310 shown in FIG. 3A is in an erase state. As a result, output terminal 313 is electrically isolated from input terminal 312 and bitline BY which is coupled to input terminal 312.

As noted above, in a program state, the input terminal is electrically coupled to the output terminal of the 3T device. Second 3T device 320 shown in FIG. 3A is in a program state. As shown in FIG. 3A, bridge 326 electrically couples input terminal 322 to output terminal 323. As also shown in FIG. 3A, input terminal 322 is electrically connected to bitline BY*. As a result, output terminal 323 is electrically connected to bitline BY*.

As noted above, memory circuit 300 also includes freeze NOR gate 350 and test switch 360. Freeze NOR gate 350 and test switch 360 are coupled to first 3T device 310 and second 3T device 320. The function and coupling of freeze NOR gate 350 and test switch 360 are identical to those of freeze NOR gate 250 and test switch 260 (shown in FIG. 2). As the function and coupling of freeze NOR gate 250 and test switch 260 have been described above, those of freeze NOR gate 350 and test switch 360 will not be further described herein.

In one embodiment, as in the example above, the input terminal voltage is in the range of Vcc and ground potential. On the other hand, the address terminal voltage is in the range of positive threshold voltage to negative threshold voltage, where the magnitude of the positive threshold voltage (or of the negative threshold voltage) is greater than Vcc. In such an embodiment, for data signals on the bitlines, a high binary value data signal is one at Vcc and a low binary value data signal is one at ground. Also, in such an embodiment, Vcc and ground are respectively a high binary value and a low binary value for NOR gate 350 and test switch 360. In such an embodiment, devices (e.g., NOR gate 350 and test switch 360) operating at Vcc are shielded from the higher voltages, such as the threshold voltage of 2.5 volts. In another embodiment, the devices operating at Vcc are tolerant of the higher voltage of 2.5 volts.

In another embodiment, in the context of a 3T device, the input terminal voltage may be in the range of positive threshold voltage to negative threshold voltage, where the magnitude of the positive threshold voltage (or the negative threshold voltage) is greater than Vcc. During programming of the 3T device, the input terminal voltage may be in the above range. However, during user mode, the input terminal voltage may still be in the Vcc to ground potential range. In such an embodiment, an input circuit such as that shown in FIG. 3B and freeze and test circuit such as that shown in FIG. 3C may be used.

Figure 3B:
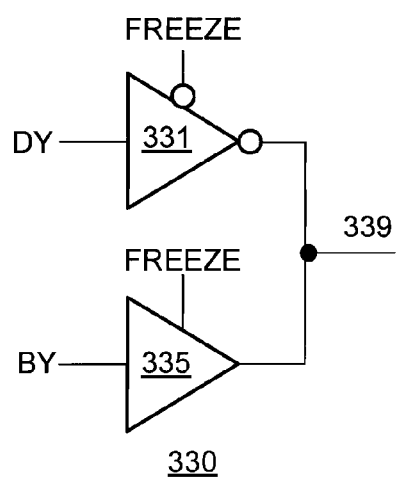
FIG. 3B is a schematic diagram illustrating one embodiment of an input circuit in the memory circuit of FIG. 3A.

In FIG. 3B, input circuit 330 includes tristate inverter 331 and tristate driver 335 connected as shown. In one embodiment, tristate inverter 331 has a supply voltage of Vcc and tristate driver 335 has a supply voltage at the threshold voltage of 2.5 volts. Tristate inverter 331 outputs an output signal of Vcc or ground, whereas tristate driver 335 outputs an output signal at the threshold voltage of 2.5 volts or ground. In input circuit 330, tristate inverter 331 is a low active tristate inverter (i.e., it is active when its control signal, the FREEZE signal, has a low binary value). In one embodiment, tristate inverter 331 is tolerant to a high voltage in the threshold voltage range. Input circuit 330 may be coupled to input terminal 312 of 3T device 310 (shown in FIG. 3A). A similar input circuit would be coupled to input terminal 322 of 3T device 320 (shown in FIG. 3A).

Input circuit 330 receives data signal from data terminal DY and bitline signal from bitline terminal BY and outputs a signal on terminal 339 which is connected to input terminal 312 of 3T device 310. Tristate inverter 331 receives the data signal on data terminal DY as an input and provides the complement of the data signal as an output when tristate inverter 331 is switched on. Tristate inverter 331 is off when the FREEZE signal has a high binary value. In other words, when the memory circuit is in program mode and the FREEZE signal has a high binary value, tristate inverter 331 is off. On the other hand, when the memory circuit is in user mode and the FREEZE signal has a low binary value, tristate inverter 331 is on. On the other hand, tristate driver 335 is on when the FREEZE signal has a high binary value, which is the case during programming. Tristate driver 335 is off when the FREEZE signal has a low binary value which is the case during user mode. Thus, in one embodiment, during programming, tristate driver 335 is on while tristate inverter 331 is off, whereas during user mode, tristate driver 335 is off while tristate inverter 331 is on.

Figure 3C:
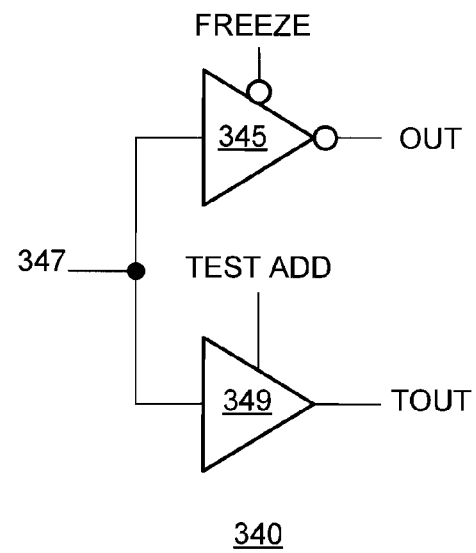
FIG. 3C is a schematic diagram illustrating another embodiment of the freeze and test circuit in the memory circuit of FIG. 3A.

FIG. 3C is a schematic diagram illustrating another embodiment of the freeze and test circuit in the memory circuit of FIG. 3A. In FIG. 3C, freeze and test circuit 340 includes tristate inverter 345 and tristate driver 349 which are connected as shown. In one embodiment, freeze and test circuit 340 is used instead of NOR gate 350 and test switch 360 in memory circuit 300 (shown in FIG. 3A). In such a case, input terminal 347 of freeze and test circuit 340 would be coupled to output terminal 313 of 3T device 310 and output terminal 323 of 3T device 320 (shown in FIG. 3A). In one embodiment, tristate inverter 345 and tristate driver 349 have a supply voltage of Vcc. In one embodiment, tristate inverter 345 and tristate driver 349 are tolerant to the threshold voltage of 2.5 volts. In another embodiment, tristate inverter 345 has a supply voltage at the threshold voltage of 2.5 volts and may receive input signals at the threshold voltage of 2.5 volts.

Tristate inverter 345 is a low active inverter and, therefore, is on when the FREEZE signal has a low binary value, which is not the case during programming. When it is on, tristate inverter 345 inverts its input signal. During user mode, tristate inverter 345 is on. On the other hand, during programming, tristate inverter 345 is off and its output is not driven by tristate inverter 345. Tristate driver 349 is on when TEST ADD signal has a high binary value, i.e., during testing. When on, tristate driver 349 outputs an output test signal TOUT.

Figure 3D:
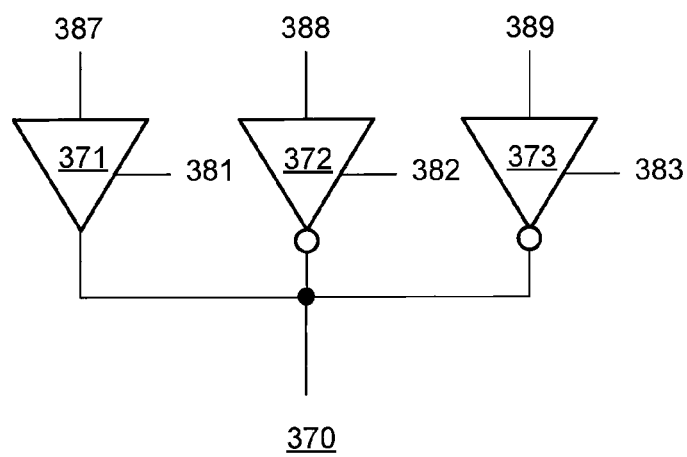
FIG. 3D illustrates an embodiment of the input circuit for the address line AX in FIG. 3A.

FIG. 3D illustrates an embodiment of the input circuit for the address line AX in FIG. 3A. In FIG. 3D, input circuit 370 includes tristate driver 371, tristate inverter 372, and tristate inverter 373. Tristate driver 371, tristate inverter 372, and tristate inverter 373 have supply voltages of 2.5 volts, −2.5 volts, and Vcc, respectively. The states of tristate driver 371, tristate inverter 372, and tristate inverter 373 are controlled by control signals 381, 382, and 383, respectively. Tristate driver 371, tristate inverter 372, and tristate inverter 373 are respectively active when control signals 381, 382, and 383 respectively have a high binary value. The input signals to tristate driver 371, tristate inverter 372, and tristate inverter 373 are input signals 387, 388, and 389, respectively. Tristate driver 371 is active when it is desired to provide the AX line with 2.5 volt. Tristate inverter 372 is active when it is desired to provide the AX line with −2.5 volt. Tristate inverter 373 is active when it is desired to provide the AX line with Vcc or ground potential. When tristate driver 371 is active, its input signal 387 has a high binary value. When tristate inverter 372 is active, its input signal 388 has a high binary value. When tristate inverter 373 is active, its input signal 389 may have a high binary value or a low binary value. In an active state, when its input signal 389 has a high binary value, the output of tristate inverter 373 is ground potential. On the other hand, in an active state, when its input signal 389 has a low binary value, the output of tristate inverter 373 is Vcc. It is to be noted that tristate inverter 373 is tolerant to voltages of 2.5 volts and −2.5 volts.

It is to be noted that embodiments of the memory circuits of the present invention are not limited to the threshold voltage and Vcc examples provided above. Those skilled in the art would recognize that other threshold voltages and Vcc may also be used. For example, in the context of 3T devices, another threshold voltage and Vcc may be used, where the threshold voltage is greater than Vcc.

Figure 5C:
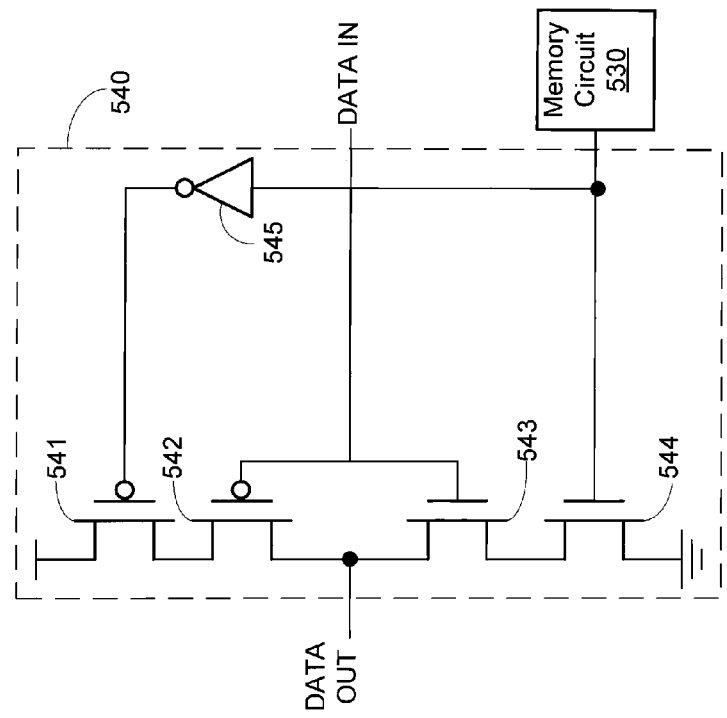
FIGS. 5A, 5B, and 5C are schematic diagrams illustrating use of memory circuits of the present invention in various contexts.
Figure 5A:
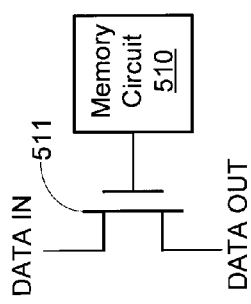
Figure 5B:
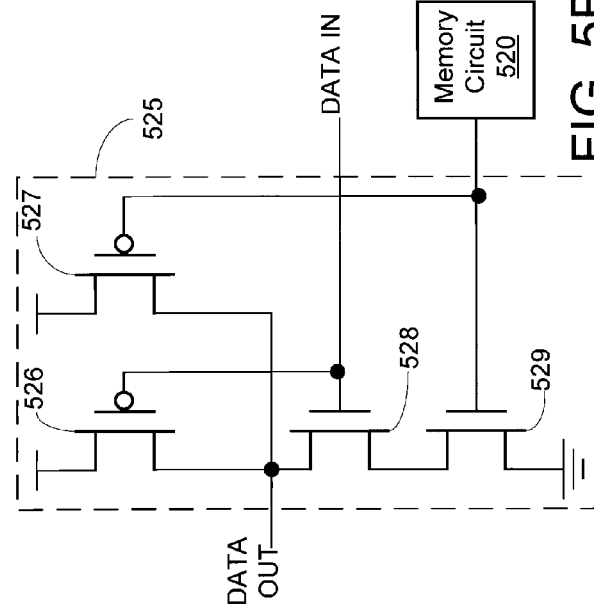

FIGS. 5A, 5B, and 5C are schematic diagrams illustrating use of memory circuits of the present invention in various contexts. It is to be noted that uses shown in FIGS. 5A-C are only a few of the many uses of embodiments of the memory circuits of the present invention.

In FIG. 5A, memory circuit 510 is coupled to the gate of pass gate 511. When memory circuit 510 stores a high binary value, pass gate 511 is on and DATA IN is electrically coupled to DATA OUT.

In FIG. 5B, memory circuit 520 is coupled to one input terminal of NAND gate 525, while DATA IN is coupled to the other input terminal of NAND gate 525. NAND gate 525 includes switches 526, 527, 528, and 529 connected as shown in FIG. 5B. When memory circuit 520 stores a low binary value, DATA OUT has a high binary value regardless of the value of DATA IN. On the other hand, when memory circuit stores a high binary value, DATA OUT is the complement of DATA IN. In other words, when DATA IN has a low binary value, DATA OUT has a high binary value, and when DATA IN has a high binary value, DATA OUT has a low binary value.

In FIG. 5C, memory circuit 530 is coupled to tristate driver 540, more specifically to the enable terminal of tristate driver 540. Tristate driver 540 includes switches 541, 542, 543, and 544 and inverter 545, which are connected as shown in FIG. 5C. When memory circuit 530 stores a high binary value, tristate buffer 540 is switched on. In such a case, DATA OUT is the complement of DATA IN. On the other hand, when memory circuit 530 stores a low binary value, tristate buffer 540 is switched off. In such a case, DATA OUT is not necessarily the complement of DATA IN.

Figure 6:
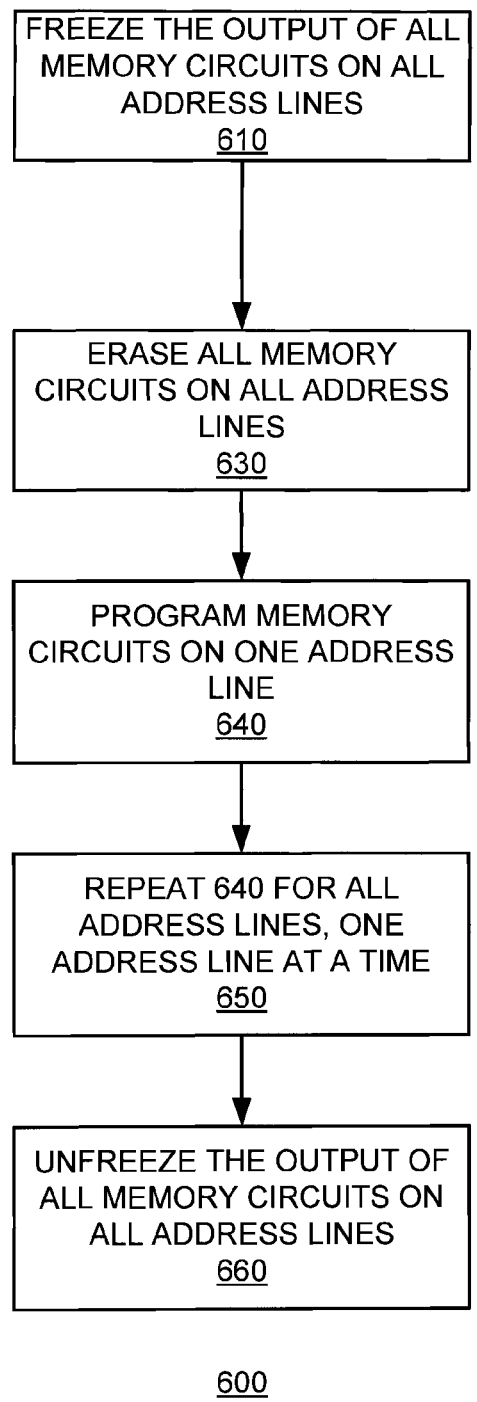
FIG. 6 is a flow chart illustrating one embodiment of the method of programming a memory array of the present invention.

FIG. 6 is a flow chart illustrating one embodiment of the method of programming a memory array of the present invention. In one embodiment, the memory array programmed using method 600 of FIG. 6 may be one whose memory circuits are all of the type shown in FIG. 2. This type of memory array is herein referred to as a cantilever device memory array or a 4T device memory array. In another embodiment, the memory array programmed using method 600 of FIG. 6 may be one whose memory circuits are all of the type shown in FIG. 3A. This type of memory array is herein referred to as a 3T device memory array or a 3T conductive bridge memory array. As such, method 600 applies to both embodiments of the memory array.

In method 600, at 610, a high binary FREEZE signal is issued to freeze the outputs of all memory circuits on all address lines. As a result, the outputs of all memory circuits on all address lines are frozen. In one embodiment, all outputs are frozen when the device that includes the memory array is powered on. At 630, all memory circuits on all address lines of the memory array are erased. In other words, all memory devices in all memory circuits are erased. At 630, in one embodiment, in a cantilever device memory array where the reference voltage terminals are grounded, for each cantilever device in the memory array, the address terminal is set at a threshold voltage (for the cantilever device) higher than input terminal. In one embodiment, this is achieved by setting each address line to Vcc (i.e., a high binary voltage) and setting each bitline to ground potential (i.e., a low binary voltage). As a result, all cantilever devices in the memory array are placed in an erase state regardless of their previous state. Similarly, in a 3T device memory array, at 630, for each 3T device, the address terminal is set at a threshold voltage (for the 3T device) below the input terminal. In one embodiment, this is achieved by placing a negative threshold voltage (i.e., −2.5 volts) on each address lines and ground potential on each bitline. In another embodiment, it may be achieved by setting all address lines at ground potential and all bitlines at a positive threshold voltage. As a result, all 3T devices in the memory array are placed in an erase state regardless of their previous state.

It is to be noted that in one embodiment, the memory devices in both the 4T memory array and the 3T memory array are initialized in the erase state. In another embodiment of a 3T device memory array, all memory devices are initialized in a program state. Thereafter, all memory devices are erased. In one embodiment, the output terminal of each memory circuit in the 3T device memory array is coupled to a respective pass gate. In one embodiment, all of these pass gates are off while all the memory devices are in the program state.

At 640, memory circuits on one address line, e.g., a first address line, are programmed. In a cantilever device memory array, at 640, the first address line is set to Vcc while all other address lines are set to ground potential. Moreover, for each memory circuit on the first address line, one cantilever device is set in a program state while the other cantilever device is set in an erase state. The bitline coupled to the cantilever device to be placed in a program state is set to Vcc, whereas the bitline coupled to the cantilever device to be placed in an erase state is set to ground potential. For example, with reference to FIG. 2, if it is desired to place cantilever device 210 in an erase state and cantilever device 220 in a program state, then address line AX is set to Vcc, bitline BY is set to a ground potential, and bitline BY* is set to Vcc.

In a 3T device memory array, at 640, the first address line is set to the threshold voltage (i.e., 2.5 volts) while all other address lines are set to Vcc (which is lower than the threshold voltage). In one embodiment of a 3T device, with the address line at Vcc, the 3T device remains at its previous state even if the bias of the input terminal, i.e., the bitline terminal, is at the threshold voltage or at Vcc. Moreover, for each memory circuit on the first address line, one 3T device is set in a program state while the other 3T device is maintained in the erase state. The bitline coupled to the 3T device to be placed in a program state is set to ground potential, whereas the bitline coupled to the 3T device to be maintained in the erase state is set to Vcc. For example, with reference to FIG. 3A, if it is desired to maintain 3T device 310 in the erase state and place 3T device 320 in a program state, then address line AX is set to the threshold voltage, bitline BY is set to Vcc, and bitline BY* is set to ground potential. It is to be noted that placing the bitline BY to the threshold voltage would also maintain 3T device 310 in the erase state.

At 650, 640 is performed for all of the address lines, one address line at a time. For example, after performing 640 for the first address line, it is performed for the second address line. In a cantilever device memory array, in one embodiment, when performing 640 for the second address line, the second address line is set to Vcc while all other address lines are set to ground potential. In a 3T device memory array, in one embodiment, when performing 640 for the second address line, the second address line is set to the threshold voltage while all other address lines are set to Vcc. This continues for all address lines, one address line at a time.

At 660, the outputs of all memory circuits on all address lines are unfrozen. In other words, the freeze signal for all freeze circuit is set to a low binary value. In one embodiment, this is done once all memory circuits in the memory array have been programmed.

In one embodiment, either between 650 and 660 or after 660, in a cantilever device memory array, all address lines are set to ground potential. In one embodiment, either between 650 and 660 or after 660, in a 3T device memory array, all address lines are set to Vcc.

In one embodiment, after 660, for each memory circuit that is desired to be tested, the test switch associated with that memory circuit is switched on and the memory devices of the memory circuit are tested. In one embodiment, all memory circuits in a memory array are tested.

In user mode, for each bitline pair, i.e., BY and BY*, bitline BY has a binary value that is the complement of the binary value for its corresponding bitline pair BY*. For example, when bitline BY has a high binary value bitline voltage, then bitline BY* has a low binary value bitline voltage.

It is to be noted that, in each memory circuit in memory array 100, one memory device is to be programmed in the program state and the other memory device is to be programmed in the erase state. Moreover, each memory circuit is to be programmed to store one bit of data. Additionally, the test switch is to be switched on to test the two memory devices of the memory circuit.

It is also to be noted that the memory devices of a memory circuit maintain their previous states (whether program or erase) when the power supplied to the memory circuit is turned off. As such, embodiments of the memory devices and memory circuits of the present invention are non-volatile. For example, as can be seen from Table 1 above, when a ground potential is applied to the reference voltage terminal, the address terminal, and the input terminal of a cantilever device (which would be the case when power is turned off), then the cantilever device maintains its previous state (whether program or erase). In fact, the cantilever device would maintain its previous state even when the input terminal is at a high binary voltage provided that the reference voltage terminal and the address terminal are at ground potential. Similarly, as can be seen from Table 2 above, when a ground potential is applied to the address terminal and the input terminal of a 3T conductive bridge device (which would be the case when power is turned off), then the 3T conductive bridge device maintains its previous state (whether program or erase). In fact, the 3T conductive bridge device would maintain its previous state even when the input terminal and the address terminal are at a high binary voltage. More generally, the 3T conductive bridge device would maintain its previous state so long as there is a non-threshold voltage difference between the voltages at the input terminal and the address terminal.

Figure 7:
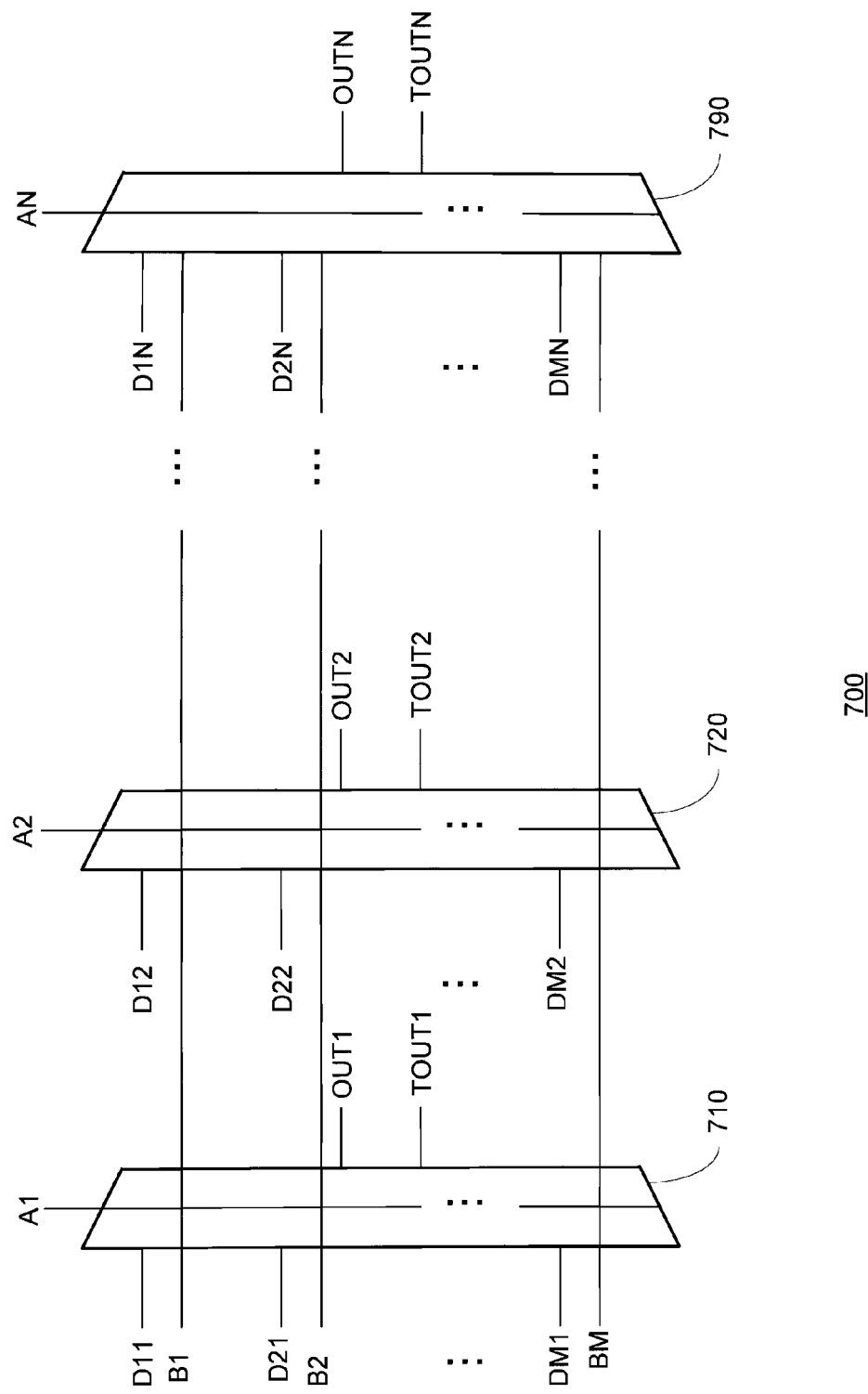
FIG. 7 is a block diagram of one embodiment of a multiplexer array of the present invention.

FIG. 7 is a block diagram of one embodiment of a multiplexer array of the present invention. In FIG. 7, multiplexer array 700 includes multiplexers 710, 720, and 790. Multiplexer 710 is coupled to address line A1, bitlines B1, B2, and BM, and data lines D11, D21, and DM1. A multiplexer coupled to an address line may also herein be referred to as a multiplexer on an address line. Multiplexer 710 provides output OUT1 and test output TOUT1. Multiplexer 720 is coupled to address line A2, bitlines B1, B2, and BM, and data lines D12, D22, and DM2. Multiplexer 720 provides output OUT2 and test output TOUT2. Multiplexer 790 is coupled to address line AN, bitlines B1, B2, and BM, and data lines D1N, D2N, and DMN. Multiplexer 790 provides output OUTN and test output TOUTN. As shown in FIG. 7, bitlines B1, B2, and BM apply to all the multiplexers in multiplexer array 700. It is to be noted that horizontally orientated ellipses in FIG. 7 represent one or more multiplexers in multiplexer array 700 that are not shown. It is also to be noted that vertically orientated ellipses in FIG. 7 represent one or more data lines and bitlines in multiplexer array 700 that are not shown.

Although, in FIG. 7, each of the multiplexers is shown to be an M to 1 multiplexer, it is to be noted that in another embodiment, not all multiplexers in multiplexer array 700 need be the same size. The size of each multiplexer would depend on the number of switches in each multiplexer. Additionally, one or more multiplexers may be M to Z multiplexers, where Z is an integer greater than 1 and less than M.

Figure 8:
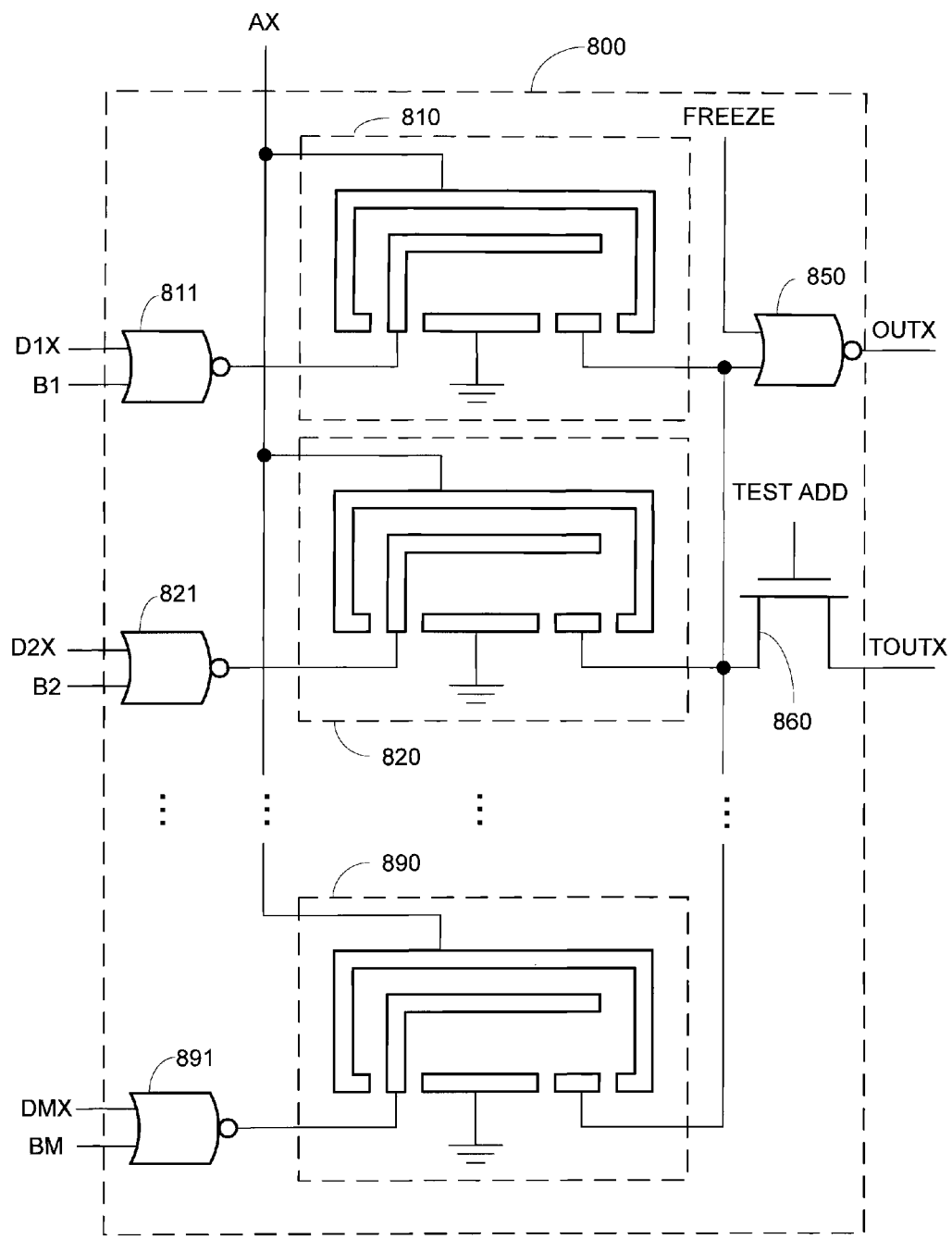
FIG. 8 is a detailed diagram of one embodiment of a multiplexer in the multiplexer array of FIG. 7.

FIG. 8 is a detailed diagram of one embodiment of a multiplexer in the multiplexer array of FIG. 7. In FIG. 8, multiplexer 800 includes cantilever device 810, cantilever device 820, cantilever device 890, freeze NOR gate 850, test switch 860, and input NOR gates 811, 821, and 891. Multiplexer 800 receives bitline signals B1, B2, and BM and data signals D1X, D2X, and DMX as inputs signals and provides output signal OUTX and test output signal TOUTX as output signals. In one embodiment, cantilever device 810, cantilever device 820, and cantilever device 890 may be such as those provided by Cavendish Kinetics of San Jose, Calif. It is to be noted that ellipses in FIG. 8 represent one or more cantilever devices and one or more input NOR gates in multiplexer 800 that are not shown.

Cantilever device 810 is coupled to address line AX, input NOR gate 811, freeze NOR gate 850, and test switch 860. More specifically, the address terminal, the input terminal, and the output terminal of cantilever device 810 are respectively coupled to address line AX, input NOR gate 811, and freeze NOR gate 850. The reference voltage terminal of cantilever device 810 is grounded. The output terminal of cantilever device 810 is also coupled to test switch 860.

Similarly, cantilever device 820 is coupled to address line AX, input NOR gate 821, freeze NOR gate 850, and test switch 860. More specifically, the address terminal, the input terminal, and the output terminal of cantilever device 820 are respectively coupled to address line AX, input NOR gate 821, and freeze NOR gate 850. The reference voltage terminal of cantilever device 820 is grounded. The output terminal of cantilever device 820 is also coupled to test switch 860.

Similarly, cantilever device 890 is coupled to address line AX, input NOR gate 891, freeze NOR gate 850, and test switch 860. More specifically, the address terminal, the input terminal, and the output terminal of cantilever device 890 are respectively coupled to address line AX, input NOR gate 891, and freeze NOR gate 850. The reference voltage terminal of cantilever device 890 is grounded. The output terminal of cantilever device 890 is also coupled to test switch 860.

Input NOR gate 811 is coupled to D1X on one of its input terminals and B1 on its other input terminal. The output terminal of input NOR gate 811 is coupled to the input terminal of cantilever device 810. Input NOR gate 821 is coupled to D2X on one of its input terminals and B2 on its other input terminal. The output terminal of input NOR gate 821 is coupled to the input terminal of cantilever device 820. Input NOR gate 891 is coupled to DMX on one of its input terminals and BM on its other input terminal. The output terminal of input NOR gate 891 is coupled to the input terminal of cantilever device 890.

During programming of multiplexer 800, data inputs D1X, D2X, DMX all have binary low values. As a result, for input NOR gates 811, 821, and 891, the outputs during programming are the complement of bitline inputs B1, B2, and BM, respectively. Similarly, during user mode, bitline inputs B1, B2, and BM all have binary low values. As a result, for input NOR gates 811, 821, and 891, the outputs in user mode are the complement of data inputs D1X, D2X, and DMX, respectively.

Freeze NOR gate 850 and test switch 860 function in a manner similar to their counterparts in memory circuit 200 (shown in FIG. 2). As shown in FIG. 8, freeze NOR gate 850 is coupled to the output terminal of all cantilever devices in multiplexer 800. Similarly, as shown in FIG. 8, test switch 860 is coupled to the output terminal of all cantilever devices in multiplexer 800.

As noted above, in one embodiment, the high binary voltage values and low binary voltage values for the cantilever devices (more specifically, the address terminals, input terminals, and output terminals of the cantilever devices) are the same as those for the logic devices, e.g., NOR gates, and test switches. More specifically, in one embodiment, the high binary voltage value is Vcc and the low binary voltage value is ground potential for both cantilever devices and logic devices and test switches.

In FIG. 8, freeze NOR gate 850 and test switch 860 are shown as being included in multiplexer 800. In another embodiment, multiplexer 800 may be defined not to include freeze NOR gate 850 and test switch 860. In such a case, multiplexer 800 would have one output terminal and freeze NOR gate 850 and test switch 860 would be coupled to that output terminal. Also, although in multiplexer 800, freeze NOR gate 850 is used for a freeze circuit, in another embodiment, another logic device or combination of logic devices may be used to represent the freeze circuit. For example, in another embodiment, a NAND gate may be used to represent the freeze circuit.

Similarly, in FIG. 8, input NOR gates 811, 821, and 891 are shown as being included in multiplexer 800. In another embodiment, multiplexer 800 may be defined not to include input NOR gates 811, 821, and 891. In such a case, multiplexer 800 would have M input terminals, rather than 2M input terminals as shown in FIG. 8. Also, although in multiplexer 800, input NOR gates 811, 821, and 891 are used for input select circuits, in another embodiment, another logic device or combination of logic devices may be used to represent the input select circuits. For example, in another embodiment, a NAND gate may be used to represent the input select circuit.

Figure 9A:
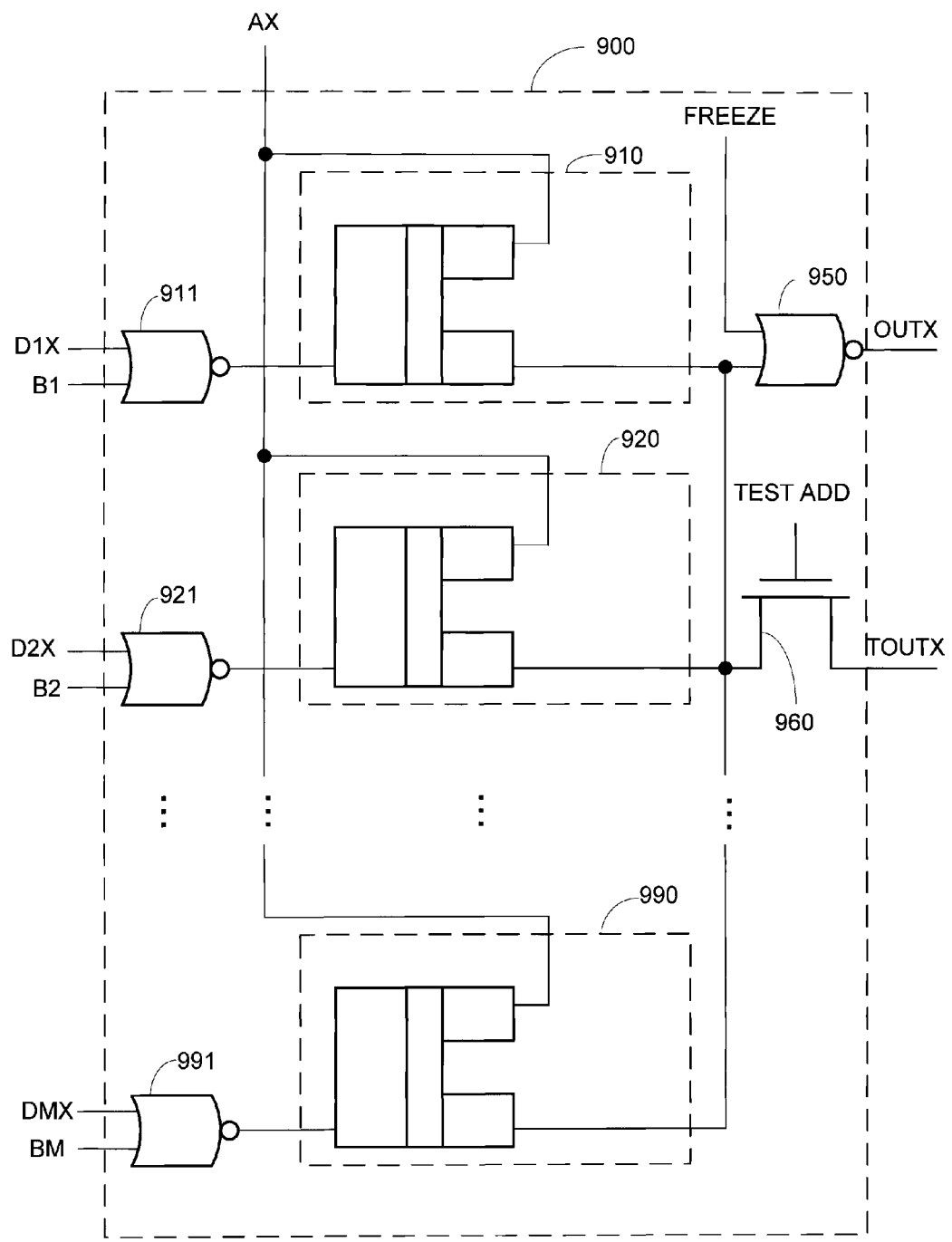
FIG. 9A is a detailed diagram of another embodiment of a multiplexer in the multiplexer array of FIG. 7.

FIG. 9A is a detailed diagram of another embodiment of a multiplexer in the multiplexer array of FIG. 7. In FIG. 9A, multiplexer 900 includes 3T device 910, 3T device 920, 3T device 990, freeze NOR gate 950, test switch 960, and input NOR gates 911, 921, and 991. Multiplexer 900 receives bitline signals B1, B2, and BM and data signals D1X, D2X, and DMX as inputs signals and provides output signal OUTX and test output signal TOUTX as output signals. In one embodiment, 3T device 910, 3T device 920, and 3T device 990 are each a 3T device such as 3T device 400 (shown in FIG. 4). Multiplexer 900 is functionally and structurally similar to multiplexer 800. One key difference between multiplexers 800 and 900 is that multiplexer 800 uses cantilever devices as switches whereas multiplexer 900 uses 3T devices for that purpose. It is to be noted that ellipses in FIG. 9A represent one or more 3T devices and one or more input NOR gates in multiplexer 900 that are not shown.

With the exception noted above, multiplexer 900 is similar to multiplexer 800. Components and signals in multiplexer 900 that serve similar functions as their counterparts in multiplexer 800 have been designated with reference numbers that differ from those of their counterparts by one hundred. For example, freeze NOR gate 950 and test switch 960 in multiplexer 900 respectively correspond to freeze NOR gate 850 and test switch 860 in multiplexer 800. As multiplexer 900 is similar to multiplexer 800 and operates in a similar fashion and as multiplexer 800 has been described in detail above, multiplexer 900 will not be described in greater detail herein.

As noted above, in one embodiment, all high binary voltage values (i.e., Vcc) and low binary voltage values (i.e., ground potential) for the 3T devices and bitlines are the same as those for the NOR gates, the test switches, and the data signals. On the other hand, in one embodiment, the threshold voltage for the 3T devices is 2.5 volts, which is higher than Vcc.

In another embodiment, the input terminal voltages may be in the range of −2.5 volts (the negative threshold voltage) to 2.5 volts (the positive threshold voltage). During programming, the input terminals voltages would be in the above range. On the other hand, during user mode, the input voltage would be in the Vcc (which is lower than positive threshold voltage) to ground potential range. In such an embodiment, an input circuit such as that shown in FIG. 9B and freeze and test circuit such as that shown in FIG. 9C may be used.

Figure 9B:
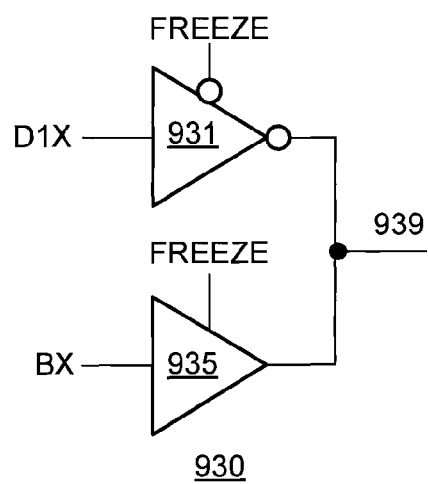
FIG. 9B is a schematic diagram illustrating another embodiment of an input circuit in the multiplexer of FIG. 9A.

In FIG. 9B, input circuit 930 includes tristate inverter 931 and tristate driver 935 connected as shown. In one embodiment, tristate inverter 931 has a supply voltage of Vcc and tristate driver 935 has a supply voltage at the threshold voltage (which is higher than Vcc). In one embodiment, tristate inverter 931 is tolerant to the threshold voltage. In one embodiment, input circuits, such as input circuit 930, may be used in place of input NOR gates 911, 921, and 991 in multiplexer 900 (shown in FIG. 9A).

Tristate inverter 931 receives data signal D1X as an input signal and is turned on and off depending on the state of the FREEZE signal. Tristate driver 935 receives bitline signal BX as an input signal and is turned on and off depending on the state of the FREEZE signal. The output terminal of input circuit 930 is coupled to the input terminal of 3T device 910 (shown in FIG. 9A). Similar input circuits would be similarly coupled to the input terminals of their respective 3T devices in multiplexer 900 (shown in FIG. 9A).

With possible exceptions noted above, input circuit 930 is similar to input circuit 330 (shown in FIG. 3B). Components and signals in input circuit 930 that serve similar functions as their counterparts in input circuit 330 have been designated with reference numbers that differ from those of their counterparts by six hundred. For example, tristate inverter 931 in input circuit 930 corresponds to tristate inverter 331 in input circuit 330. As input circuit 930 is similar to input circuit 330 and operates in a similar fashion and as input circuit 330 has been described in detail above, input circuit 930 will not be described in greater detail herein.

Figure 9C:
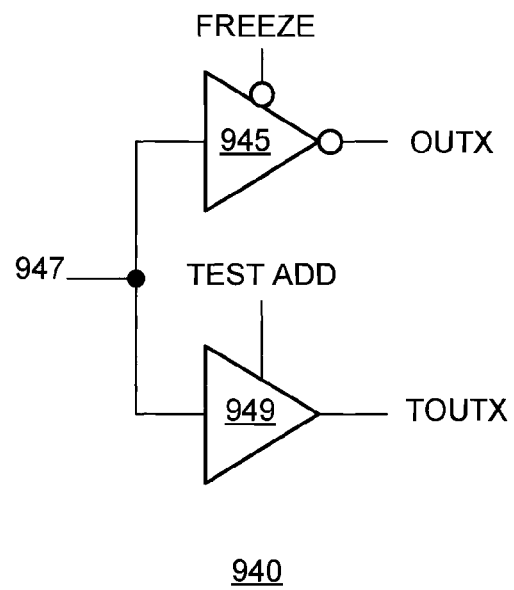
FIG. 9C is a schematic diagram illustrating another embodiment of the freeze and test circuit in the multiplexer of FIG. 9A.

FIG. 9C is a schematic diagram illustrating another embodiment of the freeze and test circuit in the memory circuit of FIG. 9A. In FIG. 9C, freeze and test circuit 940 includes tristate inverter 945 and tristate driver 949, which are connected as shown. In one embodiment, freeze and test circuit 940 is used instead of NOR gate 950 and test switch 960 in multiplexer 900 (shown in FIG. 9A). In such a case, input terminal 947 of freeze and test circuit 940 would be coupled to the output terminals of all 3T devices in multiplexer 900. In one embodiment, the supply voltages for tristate inverter 945 and tristate driver 949 are at Vcc. In one embodiment, tristate inverter 945 and tristate driver 949 are tolerant to the threshold voltage. In another embodiment, the supply voltage for tristate inverter 945 is at the threshold voltage.

Tristate inverter 945 is a low active inverter and is, therefore, on when the FREEZE signal has a low binary value, which is not the case during programming. When it is on, tristate inverter 945 inverts its input signal. During user mode, tristate inverter 945 is on. On the other hand, during programming, tristate inverter 945 is off and its output is not driven by tristate driver 945. Tristate driver 949 is on when TEST ADD signal has a high binary value, i.e., during testing. When on, tristate driver 949 outputs an output test signal TOUTX.

Figure 9D:
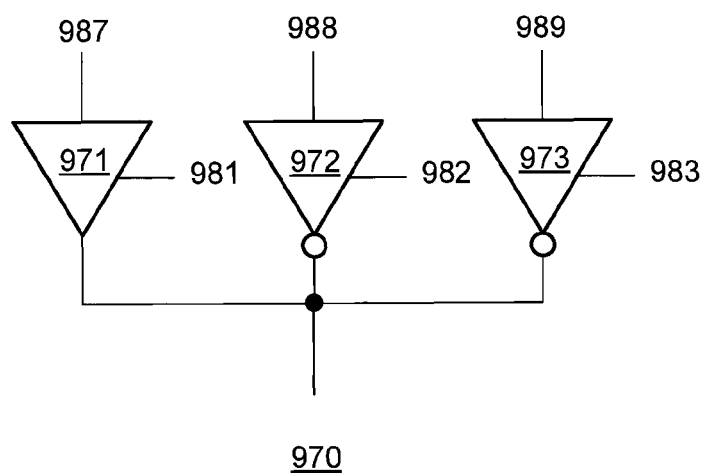
FIG. 9D illustrates an embodiment of the input circuit for the address line AX in FIG. 9A.

FIG. 9D illustrates an embodiment of the input circuit for the address line AX in FIG. 9A. In FIG. 9D, input circuit 970 includes tristate driver 971, tristate inverter 972, and tristate inverter 973. The states of tristate driver 971, tristate inverter 972, and tristate inverter 973 are controlled by control signals 981, 982, and 983, respectively. The input signals to tristate driver 971, tristate inverter 972, and tristate inverter 973 are input signals 987, 988, and 989, respectively. Input circuit 970 is similar to input circuit 370 (shown in FIG. 3D). Components and signals in input circuit 970 that serve similar functions as their counterparts in input circuit 370 have been designated with reference numbers that differ from those of their counterparts by six hundred. For example, tristate driver 931 and control signal 981 in input circuit 970 respectively correspond to tristate driver 371 and signal 381 in input circuit 370. As input circuit 970 is similar to input circuit 370 and operates in a similar fashion and as input circuit 370 has been described in detail above, input circuit 970 will not be described in greater detail herein.

Figure 10:
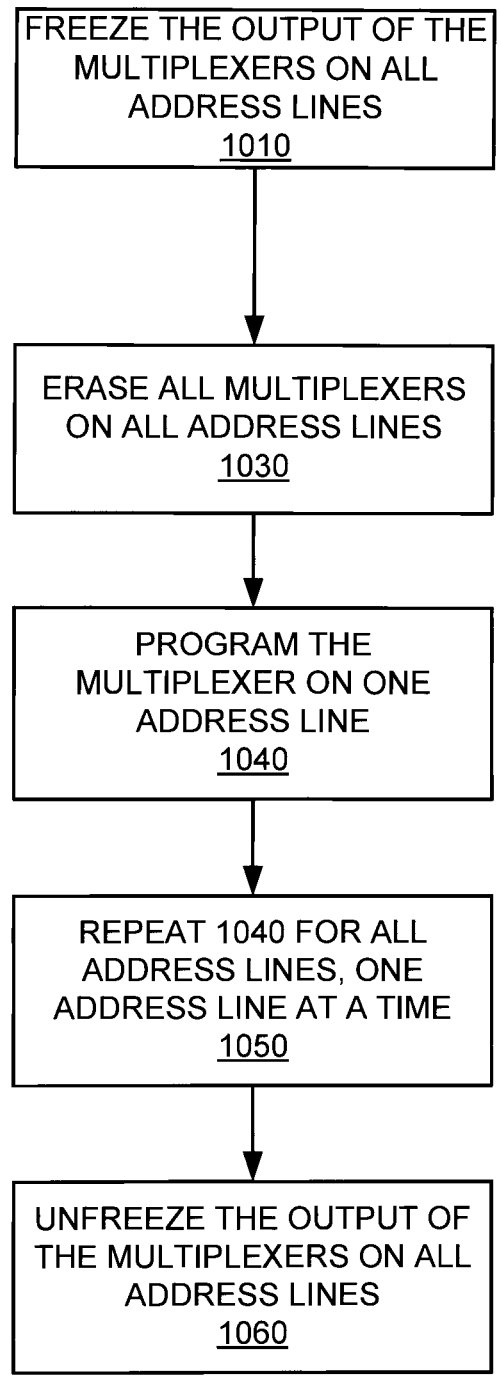
FIG. 10 is a flow chart illustrating one embodiment of the method of programming a multiplexer array of the present invention.

FIG. 10 is a flow chart illustrating one embodiment of the method of programming a multiplexer array of the present invention. In one embodiment, the multiplexer array programmed using method 1000 of FIG. 10 may be one whose multiplexers are all of the type shown in FIG. 8. This type of multiplexer array is herein referred to as a cantilever device multiplexer array or a 4T device multiplexer array. In another embodiment, the multiplexer array programmed using method 1000 of FIG. 10 may be one whose multiplexers are all of the type shown in FIG. 9A. This type of multiplexer array is herein referred to as a 3T device multiplexer array or a 3T conductive bridge memory array. As such, method 1000 applies to both embodiments of the multiplexer array.

In method 1000, at 1010, a high binary FREEZE signal is issued to freeze the outputs of all multiplexers on all address lines. As a result, the outputs of all multiplexers on all address lines are frozen. In one embodiment, all outputs are frozen when the device that includes the multiplexer array is powered on. At 1030, all the multiplexers (more specifically cantilever devices or 3T devices) on all address lines of the multiplexer array are erased. In other words, all memory devices in all of the multiplexers are erased. At 1030, in a cantilever device multiplexer array, with all the reference voltage terminals grounded, for each cantilever device in the multiplexer array, the address terminal is set at a threshold voltage (for the cantilever device) higher than the input terminal. As a result, all cantilever devices in the multiplexer array are placed in an erase state regardless of their previous state. In one embodiment, this is achieved by setting each address line to Vcc and setting each bitline to Vcc. It is to be noted that, during programming, an input terminal is at ground potential when its corresponding bitline is at Vcc, because the output of the input NOR gate is the complement of the bitline input signal. Similarly, in a 3T device multiplexer array, at 1030, for each 3T device, the address terminal is set at a threshold voltage (for the 3T device) below the input terminal. As a result, all 3T devices in the memory array are placed in an erase state regardless of their previous state. In one embodiment, this is achieved by placing a negative threshold voltage (i.e., −2.5 volts) on each address lines and Vcc on each bitline. It is to be noted that, during programming, an input terminal is at ground potential when its corresponding bitline is at Vcc, because the output of the input NOR gate is the complement of the bitline input signal. In another embodiment, it may be achieved by setting all address lines at ground potential and all input terminals at a positive threshold voltage. In one embodiment, this is achieved by maintaining all address lines at a low address voltage and setting all bitlines to a high binary value (with the FREEZE signal at a high binary value) while using an input circuit such as input circuit 930 shown in FIG. 9B.

It is to be noted that in one embodiment, in the case of both 4T and 3T device multiplexer arrays, all memory devices are initialized in the erase state. In one embodiment, in the case of a 3T device multiplexer array, all memory devices are initialized in a program state. Thereafter, all memory devices are erased. In one embodiment, the output terminal of each memory device in the 3T device multiplexer array is coupled to a respective pass gate. In one embodiment, all of these pass gates are off while all the memory devices are in the program state.

At 1040, the cantilever devices or 3T devices of the multiplexer on a first address line are programmed. In one embodiment, in a cantilever device multiplexer array, at 1040, the first address line is set to Vcc while all other address lines are set to ground potential. Moreover, for the multiplexer on the first address line, one cantilever device in the multiplexer is set in a program state while all the other cantilever devices in the multiplexer are set in an erase state. The input terminal of the cantilever device to be placed in a program state is set to Vcc, whereas the input terminals of the cantilever devices to be placed in an erase state are set to ground potential. In one embodiment, to achieve this, the bitline corresponding to the cantilever device to be placed in a program state is set to ground potential, whereas the bitlines coupled to the cantilever devices to be placed in an erase state are set to Vcc. For example, with reference to FIG. 8, if it is desired to place cantilever device 820 in a program state and all other cantilever devices in multiplexer 800 in an erase state, then address line AX is set to Vcc, bitline B2 is set to ground potential, and all other bitlines are set to Vcc. It is to be noted that, during programming, an input terminal is at ground potential when its corresponding bitline is at Vcc, because the output of the input NOR gate is the complement of the bitline input signal.

In one embodiment, in a 3T device multiplexer array, at 1040, the first address line is set to the threshold voltage while all other address lines are set to Vcc. Moreover, for the multiplexer on the first address line, one 3T device is set in a program state while the other 3T devices in the multiplexer are set in an erase state. The input terminal of the 3T device to be placed in a program state is set to ground potential, whereas the input terminals of the 3T devices to be maintained in the erase state are set to Vcc. In one embodiment, to achieve this, the bitline corresponding to the 3T device to be placed in a program state is set to Vcc, whereas the bitlines coupled to the 3T devices to be placed in an erase state are set to ground potential. For example, with reference to FIG. 9A, if it is desired to place 3T device 920 in a program state and to maintain all other 3T devices in multiplexer 900 in an erase state, then address line AX is set to the threshold voltage, bitline B2 is set to Vcc, and all other bitlines are set to ground potential. It is to be noted that, during programming, an input terminal is at ground potential when its corresponding bitline is at Vcc, because the output of the input NOR gate is the complement of the bitline input signal.

At 1050, 1040 is performed for all of the address lines, one address line at a time. For example, after performing 1040 for the first address line, it is performed for the second address line. In one embodiment, in a cantilever device multiplexer array, when performing 1040 for the second address line, the second address line is set to Vcc while all other address lines are set to ground potential. In one embodiment, in a 3T device multiplexer array, when performing 1040 for the second address line, the second address line is set to the threshold voltage while all other address lines are set to Vcc. This continues for all address lines, one address line at a time.

At 1060, the outputs of all the multiplexers on all address lines are unfrozen. In one embodiment, this is done once all multiplexers in the multiplexer array have been programmed.

In one embodiment, either between 1050 and 1060 or after 1060, in a cantilever device multiplexer array, all address lines are set to ground potential. In one embodiment, either between 1050 and 1060 or after 1060, in a 3T device multiplexer array, all address lines are set to Vcc.

In one embodiment, after 1060, for each multiplexer that is desired to be tested, the test switch associated with that multiplexer is switched on and the cantilever devices or 3T devices of the multiplexer are tested. In one embodiment, all multiplexers in a multiplexer array are tested.

In user mode, all bitlines B1, B2, and BM are set at ground potential. As a result, the output of each input NOR gate is the complement of the data signal input to the input NOR gate. Moreover, the output of the input NOR gate connected to the programmed cantilever device or 3T device of the multiplexer is provided as an output of the multiplexer.

It is to be noted that when one memory device in a multiplexer (e.g., multiplexer 800 or 900 shown in FIGS. 8 and 9A, respectively) with M inputs is programmed in a program state and all other memory devices in the multiplexer are programmed in the erase state, then the multiplexer acts as an M to 1 multiplexer. On the other hand, if Z devices (where Z is as defined above) in the multiplexer are programmed in the program state and M-Z devices are programmed in the erase state, then the multiplexer acts as an M to Z multiplexer. Such a multiplexer would have Z outputs with their respective freeze circuits and test switches. In one embodiment, the Z memory devices programmed in the program state are Z consecutive memory devices.

It is also to be noted that (for reasons set forth above with respect to the non-volatility of the embodiments of the memory circuits of the present invention) embodiments of the multiplexers of the present invention are non-volatile. Also, compared to a multiplexer that uses a CRAM-based LUT for decoding (e.g., the select signals of the multiplexer), embodiments of the multiplexer of the present invention are less susceptible to soft errors and volatility issues. Also, in embodiments of the multiplexer of the present invention, the performance of the switches in the multiplexer and therefore the multiplexer itself, does not necessarily degrade with smaller process nodes used for fabricating devices making up the multiplexer. This is because, in embodiments of multiplexers of the present invention, scaling down of the process nodes does not necessarily reduce the current through the switches.

It is further to be noted that in both methods 600 and 1000, in one embodiment, steps are performed in the order presented in the respective charts of FIGS. 6 and 10. For example, in both methods 600 and 1000, the freezing is performed prior to the erasing. Similarly, the erasing is performed prior to the programming.

Figure 11:
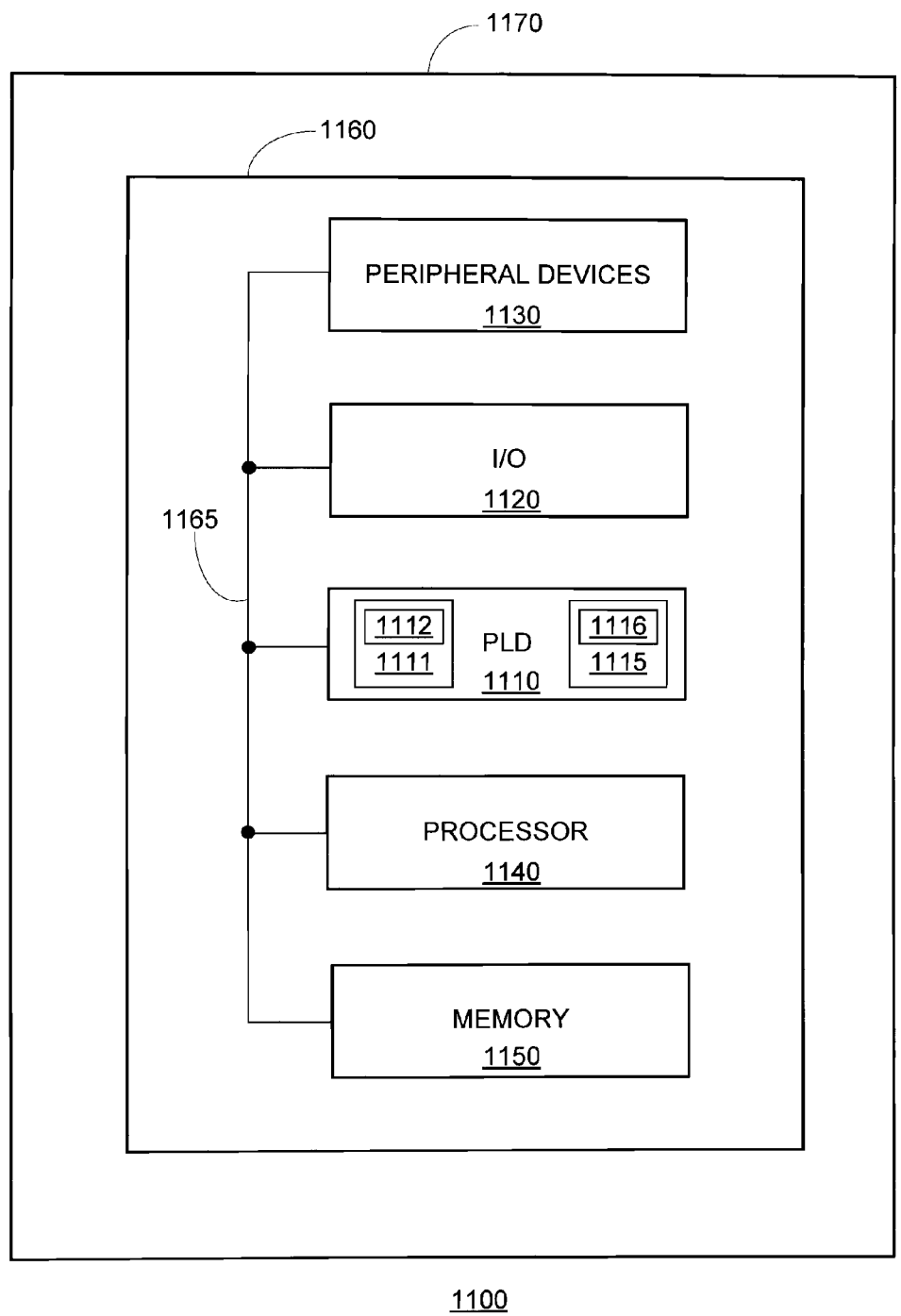
FIG. 11 illustrates an exemplary data processing system including an exemplary PLD in which memory arrays and multiplexer arrays in accordance with embodiments of the present invention might be implemented.

FIG. 11 illustrates an exemplary data processing system including an exemplary PLD in which memory arrays (and memory circuits) and multiplexer arrays (and multiplexers) in accordance with embodiments of the present invention might be implemented. FIG. 11 illustrates, by way of example, PLD 1110 in data processing system 1100. As one example, memory arrays and multiplexer arrays of this invention may be implemented in PLD 1110. In one embodiment, PLD 1110 may include a plurality of memory arrays, but only one memory array, memory array 1111, is shown to avoid overcomplicating the drawing. Memory array 1111 may include a plurality of memory circuits, but only one memory circuit, memory circuit 1112, is shown to avoid overcomplicating the drawing. Also, in one embodiment, PLD 1110 may include a plurality of multiplexer arrays, but only one multiplexer array, multiplexer array 1115, is shown to avoid overcomplicating the drawing. Multiplexer array 1115 may include a plurality of multiplexers, but only one multiplexer, multiplexer 1116, is shown to avoid overcomplicating the drawing. In one embodiment, memory array 1111 and multiplexer array 1115 are on the same die/chip as PLD 1110.

In one embodiment, memory array 1111 is a non-volatile memory array. In one embodiment, memory array 1111 may be a small embedded array block (SEAB) or a medium embedded array block (MEAB). In another embodiment, memory array 1111 may be a mega RAM (MRAM) block. In yet another embodiment, memory array 1111 may be a distributed memory. For example, embodiments of the memory circuits of the present invention may be implemented in a distributed memory within a logic block of PLD 1110. Such a distributed memory may be used to configure a LUT and to connect global and local metal signal lines. In one embodiment, this distributed implementation would replace the traditional CRAM.

Data processing system 1100 may include one or more of the following components: processor 1140, memory 1150, input/output (I/O) circuitry 1120, and peripheral devices 1130. These components are coupled together by system bus 1165 and are populated on circuit board 1160 which is contained in end-user system 1170. A data processing system such as system 1100 may include a single end-user system such as end-user system 1170 or may include a plurality of systems working together as a data processing system.

System 1100 can be used in a wide variety of applications, such as computer networking, data networking, instrumentation, video processing, digital signal processing ("DSP"), or any other application where the advantage of using programmable or reprogrammable logic is desirable. PLD 1110 can be used to perform a variety of different logic functions. For example, PLD 1110 can be configured as a processor or controller that works in cooperation with processor 1140 (or, in alternative embodiments, a PLD might itself act as the sole system processor). PLD 1110 may also be used as an arbiter for arbitrating access to shared resources in system 1100. In yet another example, PLD 1110 can be configured as an interface between processor 1140 and one of the other components in system 1100. It should be noted that system 1100 is only exemplary.

In one embodiment, system 1100 is a digital system. As used herein a digital system is not intended to be limited to a purely digital system, but also encompasses hybrid systems that include both digital and analog subsystems.

In FIG. 11, embodiments of memory arrays (and memory circuits) and multiplexer arrays (and multiplexers) of the present invention are discussed in the context of PLDs. It is to be noted, however, that embodiments of memory arrays (and memory circuits) and multiplexer arrays (and multiplexers) of the present invention are not limited to being used in only PLDs. In other words, embodiments of memory arrays (and memory circuits) and multiplexer arrays (and multiplexers) of the present invention may be used in other types of ICs.

It is to be noted that memory circuit 1112 is non-volatile and less susceptible than CRAM memory circuits to soft errors. Similarly, multiplexer 1116 is non-volatile and is less susceptible to soft errors than CRAM memory circuits for controlling a transistor-based multiplexer. Moreover, performance of multiplexer 1116 is less subject to process node limitations than the performance of multiplexers that uses transistors as switches. Additionally, memory circuits implemented using cantilever devices limit leakage currents. In fact, memory circuits implemented using cantilever devices have zero leakage currents for cantilever devices in the open state. As a result, a lower standby power is used in embodiments of the memory circuits of the present invention. Furthermore, embodiments of the memory circuits of the present invention are scalable as they are less susceptible to soft errors. As such, embodiments of the memory circuits of the present invention can be used with smaller devices fabricated using smaller process nodes.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements, including those embodiments described in the following section.

ADDITIONAL EMBODIMENTS

Embodiment 1

A memory circuit comprising: a first three-terminal (3T) resistive memory device; and a second 3T resistive memory device coupled to the first 3T resistive memory device.

Embodiment 2

The memory circuit of embodiment 1 further comprising: a freeze circuit coupled to a first output terminal and a second output terminal, wherein the first output terminal is an output terminal of the first 3T resistive memory device and the second output terminal is an output terminal of the second 3T resistive memory device.

Embodiment 3

The memory circuit of embodiment 2 further comprising: a test switch coupled to the first output terminal and the second output terminal.

Embodiment 4

The memory circuit of embodiment 3, wherein the test switch is to be switched on to test the first 3T resistive memory device and the second 3T resistive memory device.

Embodiment 5

The memory circuit of embodiment 1, wherein the first 3T resistive memory device is to be programmed in a program state and the second 3T resistive memory device is to be programmed in an erase state.

Embodiment 6

The memory circuit of embodiment 1, wherein the memory circuit is to be programmed to store one bit of data.

Embodiment 7

The memory circuit of embodiment 1, wherein the first 3T resistive memory device is a first 3T conductive bridge device and the second 3T resistive memory device is a second 3T conductive bridge device.

Embodiment 8

The memory circuit of embodiment 3, wherein the first 3T resistive memory device includes a first input terminal, a first address terminal, and the first output terminal, and the second 3T resistive memory device includes a second input terminal, a second address terminal, and the second output terminal, further wherein the first input terminal is coupled to a first bitline, the second input terminal is coupled to a second bitline, and the first and second address terminals are coupled to a first address line.

Embodiment 9

A memory array including the memory circuit of embodiment 1.

Embodiment 10

A programmable logic device including the memory circuit of embodiment 1.

Embodiment 11

A digital system comprising a programmable logic device including the memory circuit of embodiment 1.

Embodiment 12

A memory array comprising: M times N memory circuits including M rows of memory circuits coupled to M pairs of bitlines and N address lines, wherein M is an integer greater than 1, N is an integer greater than 1, each row of memory circuits of the M rows of memory circuits includes N memory circuits, each row of memory circuits is coupled to a respective pair of bitlines of the M pairs of bitlines, and each row of memory circuits is coupled to the N address lines, wherein, for each row of memory circuits, each memory circuit is coupled to a respective address line of the N address lines; M times N test switches coupled to the M times N memory circuits, wherein each test switch of the M times N test switches is coupled to an output terminal of a respective memory circuit of the M times N memory circuits; and M times N freeze circuits coupled to the M times N memory circuits, wherein each freeze circuit of the M times N freeze circuits is coupled to an output terminal of a respective memory circuit of the M times N memory circuits; wherein each memory circuit of the M times N memory circuits includes a first three-terminal (3T) conductive bridge device and a second 3T conductive bridge device coupled to the first 3T conductive bridge device, wherein an input terminal of the first 3T conductive bridge device and an input terminal of the second 3T conductive bridge device are respectively coupled to a first bitline and a second bitline of a respective pair of bitlines of the M pairs of bitlines, further wherein an address terminal of the first 3T conductive bridge device and an address terminal of the second 3T conductive bridge device are coupled to a respective address line of the N address lines, and further wherein an output terminal of the first 3T conductive bridge device and an output terminal of the second 3T conductive bridge device are coupled to a respective test switch of the M times N test switches and a respective freeze circuit of the M times N freeze circuits.

Embodiment 13

A programmable logic device including the memory array of embodiment 12.

Embodiment 14

A digital system comprising a programmable logic device including the memory array of embodiment 12.

Embodiment 15

A method of programming a memory array, the method comprising: erasing all memory circuits on all address lines of the memory array, wherein the memory array includes a plurality of address lines; and programming memory circuits in the memory array, wherein for each memory circuit of the memory circuits, the programming includes programming a first three-terminal (3T) resistive memory device of the memory circuit in a program state and programming a second 3T resistive memory device of the memory circuit in an erase state, wherein the programming is performed after the erasing.

Embodiment 16

The method of embodiment 15 further comprising: freezing outputs of all memory circuits on all address lines of the memory array, wherein the freezing is performed prior to the erasing.

Embodiment 17

The method of embodiment 15, wherein the erasing comprises: for each 3T resistive memory device in the memory array, biasing an address terminal and an input terminal of the 3T resistive memory device such that voltage at the address terminal is a threshold voltage below voltage at the input terminal, wherein each 3T resistive memory device in the memory array is a 3T conductive bridge device.

Embodiment 18

The method of embodiment 17, wherein the biasing comprises: setting the address terminal at a negative threshold voltage; and setting the input terminal at ground potential.

Embodiment 19

The method of embodiment 15, wherein the programming comprises: programming memory circuits on a first address line.

Embodiment 20

The method of embodiment 19, wherein the programming memory circuits on the first address line comprises: setting the first address line at a threshold voltage; and for each memory circuit on the first address line, setting an input terminal of a first 3T conductive bridge device at ground potential; and setting an input terminal of a second 3T conductive bridge device at a high binary voltage, wherein the threshold voltage is greater than the high binary voltage.

Embodiment 21

The method of embodiment 20 further comprising: setting all address lines other than the first address line at the high binary voltage.

Embodiment 22

The method of embodiment 19, wherein the programming further comprising: for each address line of the memory array after the first address line, one address line at a time, programming memory circuits on the one address line.

Embodiment 23

The method of embodiment 16 further comprising:
unfreezing the outputs of all memory circuits on all address lines of the memory array.

Embodiment 24

The method of embodiment 23 further comprising: testing memory circuits of the memory array.

Embodiment 25

A memory circuit comprising: a first memory device; a second memory device coupled to the first memory device; a freeze circuit coupled to a first output terminal and a second output terminal, wherein the first output terminal is an output terminal of the first memory device and the second output terminal is an output terminal of the second memory device; and a test switch coupled to the first output terminal and the second output terminal.

Embodiment 26

The memory circuit of embodiment 25, wherein the first memory device is to be programmed in a program state and the second memory device is to be programmed in an erase state.

Embodiment 27

The memory circuit of embodiment 25, wherein the memory circuit is to be programmed to store one bit of data.

Embodiment 28

The memory circuit of embodiment 25, wherein the test switch is to be switched on to test the first memory device and the second memory device.

Embodiment 29

The memory circuit of embodiment 25, wherein the first memory device is a first four-terminal (4T) microelectromechanical system (MEMS) switching device and the second memory device is a second 4T MEMS switching device.

Embodiment 30

The memory circuit of embodiment 25, wherein the first memory device is a first three-terminal (3T) conductive bridge device and the second memory device is a second 3T conductive bridge device.

Embodiment 31

The memory circuit of embodiment 25, wherein the first memory device includes a first input terminal, a first address terminal, and the first output terminal, and the second memory device includes a second input terminal, a second address terminal, and the second output terminal, further wherein the first input terminal is coupled to a first bitline, the second input terminal is coupled to a second bitline, and the first and second address terminals are coupled to a first address line.

Embodiment 32

A memory array including the memory circuit of embodiment 25.

Embodiment 33

A programmable logic device including the memory circuit of embodiment 25.

Embodiment 34

A digital system comprising a programmable logic device including the memory circuit of embodiment 25.

What is claimed is:
1. A memory circuit comprising:
a first three-terminal (3T) resistive memory device;
a second 3T resistive memory device coupled to the first 3T resistive memory device; and
a freeze circuit coupled to a first output terminal and a second output terminal, wherein the first output terminal is an output terminal of the first 3T resistive memory device and the second output terminal is an output terminal of the second 3T resistive memory device.
2. The memory circuit of claim 1 further comprising:
a test switch coupled to the first output terminal and the second output terminal.
3. The memory circuit of claim 2, wherein the test switch is to be switched on to test the first 3T resistive memory device and the second 3T resistive memory device.
4. The memory circuit of claim 1, wherein the first 3T resistive memory device is to be programmed in a program state and the second 3T resistive memory device is to be programmed in an erase state.

5. The memory circuit of claim 1, wherein the memory circuit is to be programmed to store one bit of data.

6. The memory circuit of claim 1, wherein the first 3T resistive memory device is a first 3T conductive bridge device and the second 3T resistive memory device is a second 3T conductive bridge device.

7. The memory circuit of claim 1, wherein the first 3T resistive memory device includes a first input terminal, a first address terminal, and a first output terminal, and the second 3T resistive memory device includes a second input terminal, a second address terminal, and a second output terminal, further wherein the first input terminal is coupled to a first bitline, the second input terminal is coupled to a second bitline, and the first and second address terminals are coupled to a first address line.

8. A memory array including the memory circuit of claim 1.

9. A programmable logic device including the memory circuit of claim 1.

10. A digital system comprising a programmable logic device including the memory circuit of claim 1.

11. A memory array comprising:
M times N memory circuits including M rows of memory circuits coupled to M pairs of bitlines and N address lines, wherein M is an integer greater than 1, N is an integer greater than 1, each row of memory circuits of the M rows of memory circuits includes N memory circuits, each row of memory circuits is coupled to a respective pair of bitlines of the M pairs of bitlines, and each row of memory circuits is coupled to the N address lines, wherein, for each row of memory circuits, each memory circuit is coupled to a respective address line of the N address lines;
M times N test switches coupled to the M times N memory circuits, wherein each test switch of the M times N test switches is coupled to an output terminal of a respective memory circuit of the M times N memory circuits; and
M times N freeze circuits coupled to the M times N memory circuits, wherein each freeze circuit of the M times N freeze circuits is coupled to an output terminal of a respective memory circuit of the M times N memory circuits;
wherein each memory circuit of the M times N memory circuits includes a first three-terminal (3T) conductive bridge device and a second 3T conductive bridge device coupled to the first 3T conductive bridge device, wherein an input terminal of the first 3T conductive bridge device and an input terminal of the second 3T conductive bridge device are respectively coupled to a first bitline and a second bitline of a respective pair of bitlines of the M pairs of bitlines, further wherein an address terminal of the first 3T conductive bridge device and an address terminal of the second 3T conductive bridge device are coupled to a respective address line of the N address lines, and further wherein an output terminal of the first 3T conductive bridge device and an output terminal of the second 3T conductive bridge device are coupled to a respective test switch of the M times N test switches and a respective freeze circuit of the M times N freeze circuits.

12. A programmable logic device including the memory array of claim 11.

13. A digital system comprising a programmable logic device including the memory array of claim 11.

14. A method of programming a memory array, the method comprising:

erasing all memory circuits on all address lines of the memory array, wherein the memory array includes a plurality of address lines; and
programming memory circuits in the memory array, wherein for each memory circuit of the memory circuits, the programming includes programming a first three-terminal (3T) resistive memory device of the memory circuit in a program state and programming a second 3T resistive memory device of the memory circuit in an erase state, wherein the programming is performed after the erasing.

15. The method of claim 14 further comprising:
freezing outputs of all memory circuits on all address lines of the memory array, wherein the freezing is performed prior to the erasing.

16. The method of claim 14, wherein the erasing comprises:
for each 3T resistive memory device in the memory array, biasing an address terminal and an input terminal of the 3T resistive memory device such that voltage at the address terminal is a threshold voltage below voltage at the input terminal, wherein each 3T resistive memory device in the memory array is a 3T conductive bridge device.

17. The method of claim 16, wherein the biasing comprises:
setting the address terminal at a negative threshold voltage; and
setting the input terminal at ground potential.

18. The method of claim 14, wherein the programming comprises:
programming memory circuits on a first address line.

19. The method of claim 18, wherein the programming memory circuits on the first address line comprises:
setting the first address line at a threshold voltage; and
for each memory circuit on the first address line, setting an input terminal of a first 3T conductive bridge device at ground potential and setting an input terminal of a second 3T conductive bridge device at a high binary voltage, wherein the threshold voltage is greater than the high binary voltage.

20. The method of claim 19 further comprising:
setting all address lines other than the first address line at the high binary voltage.

21. The method of claim 18, wherein the programming further comprising:
for each address line of the memory array after the first address line, one address line at a time, programming memory circuits on the one address line.

22. The method of claim 15 further comprising:
unfreezing the outputs of all memory circuits on all address lines of the memory array.

23. The method of claim 22 further comprising:
testing memory circuits of the memory array.

24. A memory circuit comprising:
a first three-terminal (3T) resistive memory device; and
a second 3T resistive memory device coupled to the first 3T resistive memory device,
wherein the first 3T resistive memory device is to be programmed in a program state and the second 3T resistive memory device is to be programmed in an erase state.

25. The memory circuit of claim 24 further comprising:
a test switch coupled to a first output terminal and a second output terminal, wherein the first output terminal is an output terminal of the first 3T resistive memory device and the second output terminal is an output terminal of the second 3T resistive memory device.

26. The memory circuit of claim 25, wherein the test switch is to be switched on to test the first 3T resistive memory device and the second 3T resistive memory device.

27. The memory circuit of claim 24, wherein the memory circuit is to be programmed to store one bit of data.

28. The memory circuit of claim 24, wherein the first 3T resistive memory device is a first 3T conductive bridge device and the second 3T resistive memory device is a second 3T conductive bridge device.

29. The memory circuit of claim 24, wherein the first 3T resistive memory device includes a first input terminal, a first address terminal, and a first output terminal, and the second 3T resistive memory device includes a second input terminal, a second address terminal, and a second output terminal, further wherein the first input terminal is coupled to a first bitline, the second input terminal is coupled to a second bitline, and the first and second address terminals are coupled to a first address line.

30. A memory array including the memory circuit of claim 24.

31. A programmable logic device including the memory circuit of claim 24.

32. A digital system comprising a programmable logic device including the memory circuit of claim 24.

33. A memory circuit comprising:
a first three-terminal (3T) resistive memory device; and
a second 3T resistive memory device coupled to the first 3T resistive memory device,
wherein the first 3T resistive memory device includes a first input terminal, a first address terminal, and a first output terminal, and the second 3T resistive memory device includes a second input terminal, a second address terminal, and a second output terminal, further wherein the first input terminal is coupled to a first bitline, the second input terminal is coupled to a second bitline, and the first and second address terminals are coupled to a first address line.

34. The memory circuit of claim 33 further comprising:
a test switch coupled to the first output terminal and the second output terminal.

35. The memory circuit of claim 34, wherein the test switch is to be switched on to test the first 3T resistive memory device and the second 3T resistive memory device.

36. The memory circuit of claim 33, wherein the memory circuit is to be programmed to store one bit of data.

37. The memory circuit of claim 33, wherein the first 3T resistive memory device is a first 3T conductive bridge device and the second 3T resistive memory device is a second 3T conductive bridge device.

38. A memory array including the memory circuit of claim 33.

39. A programmable logic device including the memory circuit of claim 33.

40. A digital system comprising a programmable logic device including the memory circuit of claim 33.

* * * * *